(12) United States Patent
Iida et al.

(10) Patent No.: US 10,236,322 B2
(45) Date of Patent: Mar. 19, 2019

(54) SOLAR CELL MODULE

(71) Applicant: Kabushiki Kaisha Toshiba, Minato-ku (JP)

(72) Inventors: Atsuko Iida, Yokohama (JP); Takeshi Gotanda, Yokohama (JP); Hideyuki Nakao, Setagaya (JP); Haruhi Oooka, Kawasaki (JP); Rumiko Hayase, Yokohama (JP); Shigehiko Mori, Kawasaki (JP); Kenji Todori, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 259 days.

(21) Appl. No.: 15/067,876

(22) Filed: Mar. 11, 2016

(65) Prior Publication Data
US 2016/0276413 A1  Sep. 22, 2016

(30) Foreign Application Priority Data

Mar. 19, 2015  (JP) .................................. 2015-056510

(51) Int. Cl.
*H01L 27/30* (2006.01)
*H01L 51/00* (2006.01)
(Continued)

(52) U.S. Cl.
CPC .......... *H01L 27/301* (2013.01); *H01L 31/046* (2014.12); *H01L 31/048* (2013.01);
(Continued)

(58) Field of Classification Search
CPC . H01L 31/048; H01L 31/0481; H01L 31/046; H01L 31/0463; H01L 31/0465;
(Continued)

(56) References Cited

U.S. PATENT DOCUMENTS 5,717,255 A * 2/1998 Haga ................... H01L 23/3164
136/251
2011/0011437 A1  1/2011 Denda et al.
(Continued)

FOREIGN PATENT DOCUMENTS

JP  2007-12377  1/2007
JP  2010-205804  9/2010
(Continued)

OTHER PUBLICATIONS

Office Action dated Jan. 26, 2016 in Japanese Patent Application No. 2015-056510 ( with English Translation).

*Primary Examiner* — Lindsey A Bernier
(74) *Attorney, Agent, or Firm* — Oblon, McClelland, Maier & Neustadt, L.L.P.

(57) ABSTRACT

A solar cell module according to an embodiment includes: a light transmissive first substrate; a second substrate; at least one cell array disposed between the first substrate and the second substrate, the cell array including a plurality of cells arranged, each of the cells including a first electrode disposed on the first substrate, an organic photoelectric conversion film disposed on the first electrode, and a second electrode disposed on the organic photoelectric conversion film; a plurality of light transmissive partition walls disposed at portions on the first substrate, the portions being located between adjacent ones of the cells and at both end portions of the cell array; and a first resin film disposed between the second substrate and each of the cells between adjacent ones of the partition walls, the cells being connected in series.

15 Claims, 27 Drawing Sheets

(51) Int. Cl.
*H01L 51/44* (2006.01)
*H01L 31/046* (2014.01)
*H01L 31/048* (2014.01)
*H01L 31/0463* (2014.01)
*H01L 31/0465* (2014.01)

(52) U.S. Cl.
CPC ...... *H01L 31/0463* (2014.12); *H01L 31/0465* (2014.12); *H01L 31/0481* (2013.01); *H01L 51/0032* (2013.01); *H01L 51/448* (2013.01); *Y02E 10/549* (2013.01); *Y02P 70/521* (2015.11)

(58) Field of Classification Search
CPC . H01L 27/301; H01L 51/448; H01L 51/0032; Y02E 10/549
See application file for complete search history.

(56) References Cited

U.S. PATENT DOCUMENTS

| 2011/0126903 | A1 | 6/2011 | Kobayashi et al. |
| 2012/0125431 | A1* | 5/2012 | Oizumi ................ H01L 51/448 136/256 |
| 2013/0180586 | A1 | 7/2013 | Maehara |

FOREIGN PATENT DOCUMENTS

| JP | 2011-23442 | 2/2011 |
| JP | 2011-151195 | 8/2011 |
| JP | 2012-59609 | 3/2012 |
| JP | 2012-64890 | 3/2012 |
| JP | 2013-16667 | 1/2013 |
| JP | 2013-16668 | 1/2013 |
| JP | 2014-64000 | 4/2014 |
| JP | 5459681 | 4/2014 |
| JP | 2016-157777 A | 9/2016 |
| WO | WO 2013/137274 A1 | 9/2013 |

* cited by examiner

SOLAR CELL MODULE

CROSS REFERENCE TO RELATED APPLICATIONS

This application is based upon and claims the benefit of priority from prior Japanese Patent Application No. 2015-056510 filed on Mar. 19, 2015 in Japan, the entire contents of which are incorporated herein by reference.

FIELD

Embodiments of the present invention relate to solar cell modules.

BACKGROUND

An organic thin-film solar cell is a solar cell that uses an organic thin-film semiconductor formed by combining a conductive polymer, a fullerene, and the like. Compared with a solar cell formed mainly with an inorganic material such as silicon, CIGS, or CdTe, an organic thin-film solar cell can be produced by a simple process like application or printing of a photoelectric conversion film. The production costs of organic thin-film solar cells can be lower accordingly. On the other hand, the photoelectric conversion efficiency and the service life of an organic thin-film solar cell are lower and shorter than those of a conventional inorganic solar cell. The same applies to thin-film solar cells using a semiconductor material having a perovskite structure.

In a typical organic thin-film solar cell module, a transparent first electrode is formed on a transparent substrate, an organic photoelectric conversion film including an active layer (a photoelectric conversion layer) is formed on the transparent electrode, a second electrode (also called a back electrode) is formed on the organic photoelectric conversion film, and a supporting substrate (also called a back substrate) is formed on the second electrode via a resin layer serving as an adhesive.

The photoelectric conversion efficiency of an organic thin-film solar cell drops during use, and the durability of the organic thin-film solar cell becomes poorer. In an organic thin-film solar cell module, one of the reasons that the photoelectric conversion efficiency drops during use is that the active layer made of an organic material has a low resistance to moisture. To prevent degradation of the active layer due to moisture and increase durability, the transparent substrate and the supporting substrate are bonded to each other with a sealing agent at end portions according to a known technique. This sealing agent has a role to prevent moisture infiltration through end portions. However, the distance from the power generating cells to the sealing agent and the width of the sealing agent add to the regions that do not contribute to power generation (such regions are referred to as the no-power generating regions). Although the amount of infiltrating moisture can be reduced with a thinner resin layer serving as an adhesive, the adhesion strength between the transparent substrate and the back substrate becomes lower, resulting in a lower module strength.

DETAILED DESCRIPTION

A solar cell module according to an embodiment includes: a light transmissive first substrate; a second substrate; at least one cell array disposed between the first substrate and the second substrate, the cell array including a plurality of cells arranged, each of the cells including a first electrode disposed on the first substrate, an organic photoelectric conversion film disposed on the first electrode, and a second electrode disposed on the organic photoelectric conversion film; a plurality of light transmissive partition walls disposed at portions on the first substrate, the portions being located between adjacent ones of the cells and at both end portions of the cell array; and a first resin film disposed between the second substrate and each of the cells between adjacent ones of the partition walls, the cells being connected in series.

The background to the development of the present invention is explained before embodiments of the present invention are described.

As a result of intensive studies, the inventors have reached a conclusion that the mechanisms described below should be produced to prevent degradation of active layers due to moisture, and increase durability.

1) The distance for moisture to travel to reach active layers (or the distance from an end portion) is increased to prolong the time for moisture to reach the active layers. Thus, degradation is delayed.

2) The thickness of a resin layer serving as an adhesive is reduced, and the amount of infiltrating moisture is reduced. Thus, degradation is delayed.

Solar cell modules that have the above mechanisms are described below as embodiments.

First Embodiment

Figure 1:
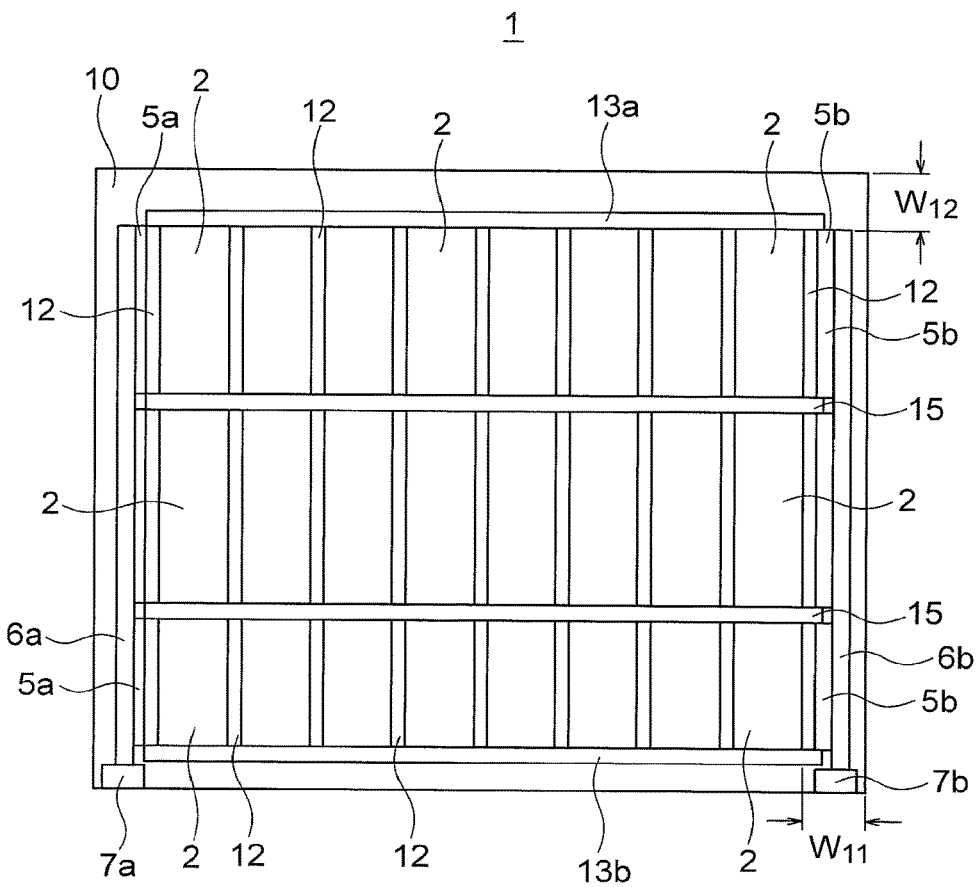
FIG. 1 is a plan view of a solar cell module according to a first embodiment.

FIG. 1 is a top view of a solar cell module according to a first embodiment. The solar cell module according to this embodiment includes cells 2 arranged in an array. FIG. 1 shows the cells 2 arranged in three rows and eight columns. The cells 2 in the same row are connected in series. Electrodes 5a and 5b are disposed at the two ends of the row of the series-connected cells 2, and these electrodes 5a and 5b are connected to leading lines 6a and 6b, respectively. These leading lines 6a and 6b are connected to leading electrodes 7a and 7b. That is, the charges obtained by photoelectric conversion at the respective cells are output to the outside via the electrodes 5a and 5b, the leading lines 6a and 6b, and the leading electrodes 7a and 7b. A gap 15 is disposed between each two adjacent rows. Protruding partition walls 12 are disposed at the two ends of each cell 2 in the row direction. Partition walls 13a and 13b shared among the respective columns are disposed at the two ends of each column of aligned cells 2.

Figure 2:
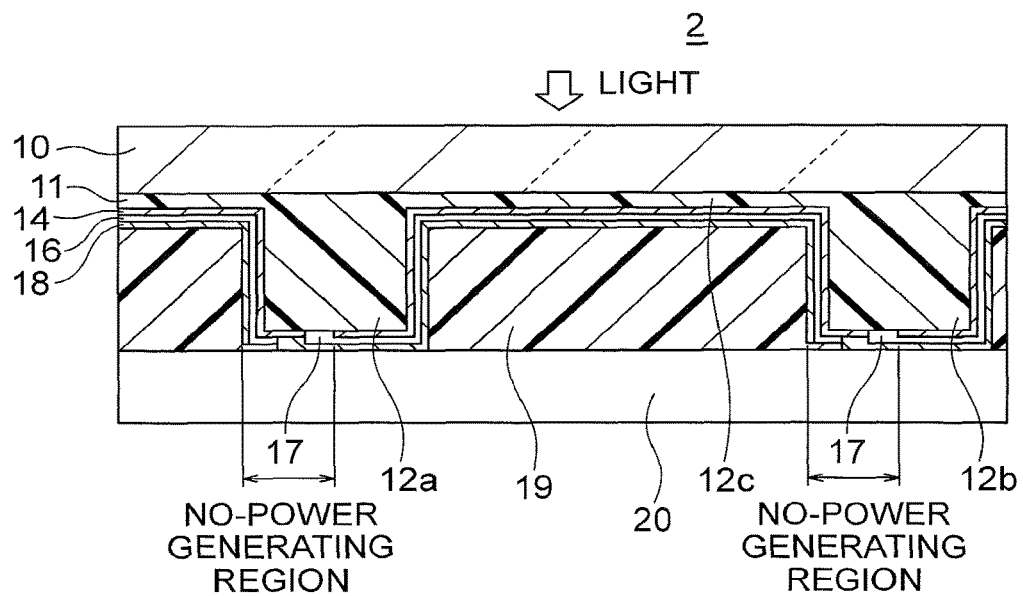
FIG. 2 is a cross-sectional view of a cell of the first embodiment.

FIG. 2 is a cross-sectional view of a cell 2, taken along a plane parallel to the row direction of the cells 2. The solar cell module 1 of this embodiment is disposed between a transparent first substrate 10 and a second substrate 20. In this specification, being transparent means having a light transmittance of 80% or higher. This solar cell module 1 is disposed on the first substrate 10, and includes the cells 2 connected in series. Each of the cells 2 includes protruding partition walls 12a and 12b disposed at the two ends of the cell, a recess 12c formed between the partition walls 12a and 12b, a transparent first electrode 14 disposed on the upper and side surfaces of the partition walls 12a and 12b and on the recess 12c, an organic photoelectric conversion film 16 disposed on the first electrode 14, a second electrode 18 disposed on the organic photoelectric conversion film 16, and a resin film 19 that is disposed on the second electrode 18 in the recess 12c and serves as an adhesive.

The partition walls 12a and 12b are shared between the adjacent cells 2, and serve as the partition walls 12 shown in FIG. 1. On the upper surfaces of the partition walls 12a and 12b, the first electrodes 14 of each two adjacent cells 2 are separated by the organic photoelectric conversion film 16, and the second electrodes 18 are separated by the resin film 19. The second electrode 18 of each of the series-connected cells 2 of the second and later rows is connected to the first electrode 14 of the previous cell on the upper surface of the corresponding partition wall 12a. In this manner, between the adjacent cells, the organic photoelectric conversion films 16 are separated on the upper surfaces of the partition walls 12a and 12b.

In this embodiment, the partition walls 12a and 12b and the recesses 12c are formed with a resin film 11 serving as the adhesive, and the resin film 19 serving as the adhesive is also formed on the second electrodes 18 in the recesses 12c. The second substrate 20 is disposed on the resin film 19.

Figure 5:
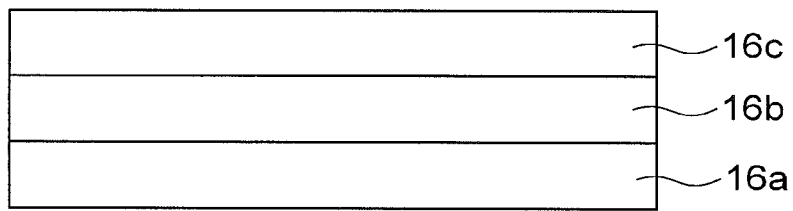
FIG. 5 is a cross-sectional diagram showing the structure of an organic photoelectric conversion film.

As shown in FIG. 5, each organic photoelectric conversion film 16 includes a first carrier transport layer 16a, a photoelectric conversion layer (also called an organic active layer) 16b disposed on the first carrier transport layer 16a, and a second carrier transport layer 16c disposed on the photoelectric conversion layer 16b. Where the first carrier transport layer 16a functions as an electron transport layer, the second carrier transport layer 16c functions as a hole transport layer. Where the first carrier transport layer 16a functions as a hole transport layer, the second carrier transport layer 16c functions as an electron transport layer.

In the case of an organic thin-film solar cell having a sequential structure, the first carrier transport layer functions as a hole transport layer, and the second carrier transport layer functions as an electron transport layer. In the case of an organic thin-film solar cell having an inverted structure, the first carrier transport layer functions as an electron transport layer, and the second carrier transport layer functions as a hole transport layer.

A hole transport layer has a function to block electrons and efficiently transport only holes, and a function to prevent disappearance of excitons generated in the interface between the photoelectric conversion layer and the hole transport layer. Likewise, an electron transport layer has a function to block holes and efficiently transport only electrons, and a function to prevent disappearance of excitons generated in the interface between the photoelectric conversion layer and the electron transport layer.

The photoelectric conversion layer 16b has a structure in which a p-type semiconductor and an n-type semiconductor form a bulk heterojunction. In this photoelectric conversion layer 16b, the p-type semiconductor and the n-type semiconductor are blended, and the pn junction on the order of nanometers spreads in the entire photoelectric conversion layer 16b. Because of this, the pn junction region is larger than that in a conventional stacked organic thin-film solar cell, and the region that actually contributes to power generation spreads in the entire photoelectric conversion layer 16b. Consequently, the region that contributes to power generation in the bulk heterojunction organic thin-film solar cell becomes conspicuously larger than that in a stacked organic thin-film solar cell, and the amount of current to be extracted increases.

In this embodiment, the organic photoelectric conversion film 16 has a stack structure formed with an electron transport layer, an organic active layer, and a hole transport layer. However, a molecular layer for controlling the bulk heterostructure of the organic active layer may be inserted into the structure of the organic photoelectric conversion film 16.

In this embodiment, the organic photoelectric conversion film 16 has a so-called inverted structure, or a structure formed by stacking an electron transport layer, an organic active layer, and a hole transport layer in this order on the transparent first electrode 14.

In the organic solar cell having an inverted structure, the organic photoelectric conversion film 16 is subjected to light such as solar light or illumination light from the side of the first substrate 10. When the light emitted onto the organic photoelectric conversion film 16 is absorbed by the organic active layer 16b, charge separation occurs in the phase interface between the p-type semiconductor and the n-type semiconductor. As a result, electrons and holes that pair with the electrons are generated. The electrons generated in the organic active layer 16b are trapped in the first electrode, and the holes are trapped in the second electrode. In the solar cell module having an inverted structure, the transparent first electrode 14 is the anode that traps the electrons, and the second electrode 18 is the cathode that traps the holes.

In an organic solar cell having a sequential structure, the transparent first electrode 14 is the cathode that traps the holes, and the second electrode 18 is the anode that traps the electrons.

The partition walls 12a and 12b and the recess 12c are located between the first substrate 10 and the second substrate 20, and function to maintain substantially a fixed distance between the two substrates. The partition walls 12a and 12b and the recess 12c are made of a light transmissive material such as an ultraviolet curable resin, epoxy resin, silicone resin, acrylic resin, fluororesin, polyethylene terephthalate (PET), polyethylene naphthalate (PEN), polycarbonate (PC), oriented polypropylene (OPP), ethylenevinyl acetate copolymer (EVA), or glass.

On the upper surface of each of the partition walls 12a and 12b, there is a no-power generating region that generates no charge. A no-power generating region is a region extending from the upper surface of the second electrode 18 of the previous cell disposed on the side surface of the current partition wall to the side surface of the first electrode 14 disposed on the current partition wall. Although the member 17 in each no-power generating region is made of the same material as the organic photoelectric conversion film 16 in this embodiment, the member 17 may be made of an insulating resin.

In this embodiment, the space between each cell 2 and the second substrate 20 is filled with the resin film 19 serving as a gel-like adhesive, and a thin portion of the resin film 19 serving as an adhesive may also exist between each of the partition walls 12a and 12b and the second substrate 20 as necessary.

In this embodiment designed as above, moisture entering through the end portions of the module 1 at which the leading lines 6a and 6b are formed is blocked by the partition walls 12a and 12b, and thus, degradation of the cells 2 can be delayed.

The resin between each of the partition walls 12a and 12b and the second substrate 20 is thin (1 µm or less, for example), or hardly exists. However, since the first substrate 10 and the second substrate 20 are in contact with the resin forming the partition walls 12a and 12b and the resin 19 disposed between the partition walls 12a and 12b, which account for the large portion of the adhesion area, a sufficiently high adhesion strength can be maintained between the first substrate 10 and the second substrate 20, and thus, the entire solar cell module can have a high mechanical strength.

Generally, in a case where pressure is applied locally onto an organic photoelectric conversion film 16, photoelectric characteristics are degraded, and the conversion rate becomes lower. In this embodiment, however, pressure can be dispersed by the partition walls 12a and 12b. Thus, resistance to bending stress can be increased without any degradation of photoelectric characteristics, and a flexible solar cell module can be obtained.

In the description below, the respective components of the organic solar cell according to this embodiment are described.

(Transparent First Substrate 10)

The substrate 10 is designed to support the other components. The substrate 10 forms an electrode, and is preferably made of a material that is not altered by heat or organic solvents. In this example, example materials that can be preferably used as the substrate 10 are materials having high optical transparency, including inorganic materials such as alkali-free glass, silica glass, and sapphire, plastic materials such as polyethylene, polyethylene terephthalate (PET), polyethylene naphthalate (PEN), polycarbonate (PC), oriented polypropylene (OPP), polyimide, polyamide, polyamideimide, liquid crystal polymers, and cycloolefin polymers, and polymer films.

The second substrate 20 can be made of the same material as the material forming the transparent first substrate 10. Alternatively, the second substrate 20 may be formed with a metal substrate made of stainless steel (SUS), aluminum, silicon, or the like, or may be formed with a film formed by depositing an aluminum film on a polymer film.

(Transparent First Electrode 14)

The transparent first electrode 14 may be made of any material that has optical transparency and electrical conductivity. Normally, a film of a transparent or semitransparent material having electrical conductivity is formed by vacuum vapor deposition, sputtering, ion plating, plating, or coating, for example. Examples of such electrode materials include conductive metal oxide films and semitransparent thin metal films. Specific examples of such electrode materials include films (such as NESA) manufactured by using conductive glass made of indium oxide, zinc oxide, tin oxide, indium zinc oxide (ITO: a compound material of the foregoing materials), fluorine-doped tin oxide (FTO), indium zinc oxide, or the like, or thin films made of gold, platinum, silver, copper, or the like. Among these materials, ITO or FTO is particularly preferable. The transparent electrode may be a single layer, or may be formed by stacking layers made of materials having different work functions. The transparent electrode may be a stack structure formed with a semitransparent metal oxide film and a thin metal film. Alternatively, the electrode material may be an organic conductive polymer, such as polyaniline or a derivative thereof, or polythiophene or a derivative thereof.

The thickness of the transparent electrode is not particularly limited, but is preferably not smaller than 10 nm and not greater than 1 µm, or more preferably, not smaller than 30 nm and not greater than 300 nm. If the thickness of the transparent electrode is too small, the sheet resistance becomes higher. If the thickness of the transparent electrode is too great, the light transmittance becomes lower, and the flexibility also becomes lower, often resulting in cracking or the like due to stress. In view of this, it is preferable to determine a thickness so as to achieve both a high light transmittance and a low sheet resistance. The sheet resistance of the first electrode 14 is not particularly limited, but is normally not higher than $10\Omega/\square$, and is preferably not higher than $500\Omega/\square$, or more preferably not higher than $200\Omega/\square$. The sheet resistance is preferably low, so as to obtain a high current.

Next, the respective components of the organic photoelectric conversion film 16 are described.

(Electron Transport Layer)

The electron transport layer is formed by a vacuum film forming method such as sputtering, a sol-gel process, or spin coating, for example. The thickness of the electron transport layer is preferably not smaller than 1 nm and not greater than 50 nm, or more preferably, not smaller than 2 nm and not greater than 20 nm. If the electron transport layer is too thin, the hole blocking effect is reduced, and is eventually lost before the generated excitons are divided into electrons and holes. As a result, current might not be efficiently extracted. If the electron transport layer is too thick, the film resistance becomes higher, and the generated current is restricted. As a result, the photoelectric conversion efficiency might become lower.

The material forming the electron transport layer should contain a metal oxide, and may contain some other material such as alkali metal salt or an organic compound material. Examples of such materials include amorphous titanium oxide ($TiO_x$) obtained by hydrolyzing titanium alkoxide by a sol-gel process, zinc oxide (ZnO), gallium oxide ($GaO_x$) formed as a film by vapor deposition, and calcium oxide ($CaO_x$). The metal oxide may be either in an amorphous form or in a crystalline form.

The film forming method may be any method by which a thin film can be formed. For example, where titanium oxide is applied spin coating, the film thickness is preferably 5 nm to 20 nm. The solution to be applied in this case is preferably filtered in advance. After a film having a predetermined thickness is formed through the application of the solution, the film is subjected to heating and drying with a hot plate or the like. The heating and drying is continued at 50° C. to 100° C. for several to ten minutes while hydrolysis is facilitated in air.

(Photoelectric Conversion Layer (Organic Active Layer))

The photoelectric conversion layer is a bulk heterojunction photoelectric conversion layer. A bulk heterojunction photoelectric conversion layer characteristically has a microlayer separation structure in which the p-type semiconductor and the n-type semiconductor are blended in a photoelectric conversion layer. At the bulk heterojunction, the blended p-type and n-type semiconductors form a pn junction on the order of nanometers in size in the photoelectric conversion layer, and current is obtained through optical charge separation that occurs in the junction plane.

The p-type semiconductor is formed with a material having electron-donating properties. Meanwhile, the n-type semiconductor is formed with a material having electron-accepting properties. In each embodiment, at least one of the p-type and n-type semiconductors may be an organic semiconductor.

The p-type organic semiconductor may be polythiophene and derivatives thereof, polypyrrole and derivatives thereof, pyrazoline derivatives, arylamine derivatives, stilbene derivatives, triphenyldiamine derivatives, oligothiophene and derivatives thereof, polyvinylcarbazole and derivatives thereof, polysilane and derivatives thereof, polysiloxane derivatives containing aromatic amines in the side chain or the main chain, polyaniline and derivatives thereof, phthalocyanine derivatives, porphyrin and derivatives thereof, polyphenylene vinylene and derivatives thereof, and polythienylene vinylene and derivatives thereof. Alternatively, some of those materials may be combined and used as the p-type semiconductor. Also, copolymers of those materials may be used, and examples of such copolymers include thiophene-fluorene copolymers and phenylene ethynylene-phenylene vinylene copolymers.

A preferable p-type organic semiconductor is a polythiophene, which is a pi-conjugated conductive polymer, and polythiophene derivatives. Polythiophene and derivatives thereof can have excellent stereoregularity, and exhibit relatively high solubility in solvents. Polythiophene and derivatives thereof are any compounds having a thiophene skeleton. Specific example of polythiophene and derivatives thereof include: polyalkylthiophenes such as poly(3-methylthiophene), poly(3-butylthiophene), poly(3-hexylthiophene), poly(3-octylthiophene), poly(3-decylthiophene), and poly(3-dodecylthiophene); polyarylthiophenes such as poly(3-phenylthiophene) and poly[3-(p-alkylphenylthiophene)]; polyalkylisothionaphthenes such as poly(3-butylisothionaphthene), poly(3-hexylisothionaphthene), poly(3-octylisothionaphthene), and poly(3-decylisothionaphthene); and polyethylenedioxythiophene.

Also, the derivatives described below are known these days as compounds with which a high photoelectric conversion efficiency can be achieved. Such derivatives include: poly[N-9''-hepta-decanyl-2,7-carbazole-alt-5,5-(4',7'-di-2-thienyl-2',1',3'-benzothiadiazole)] (PCDTBT), which is a copolymer containing carbazole, benzothiadiazole, and thiophene; and poly[[4,8-bis[(2-ethyl hexyl)oxy]benzo[1,2-b:4-5-b']dithiophene-2,6-diyl][3-fluoro-2-[(2-ethylhexyl)carbonyl]thieno[3,4-6]thiophenediyl] (PTB7), and poly[[4,8-bis[5-(2-ethylhexyl)thiophene-2-yl]benzo[1,2-b:4-5-b'] dithiophene-co-3-fluorothieno[3,4-b]thiophene-2-carboxylate] (PTB7-Th), which are copolymers containing thienothiophene and benzodithiophene.

A film of any of those conductive polymers can be formed by applying a solution of the conductive polymer dissolved in a solvent. Thus, a large-area organic thin-film solar cell can be advantageously manufactured by printing or the like with inexpensive equipment at low costs.

Fullerene or a derivative thereof is suitably used as the n-type organic semiconductor. The fullerene derivative to be used in this case can be any fullerene derivative having a fullerene skeleton. Specific examples of the fullerene derivative include derivatives having $C_{60}$, $C_{70}$, $C_{76}$, $C_{78}$, $C_{84}$, or the like as a basic skeleton. In the fullerene derivative, carbon atoms in the fullerene skeleton may be modified with any functional groups, and these functional groups may bind to each other, to form a ring. The examples of the fullerene derivative includes a fullerene bonded polymer. It is preferable to use a fullerene derivative that contains a functional group having high affinity for the solvent and is highly soluble in the solvent.

Examples of functional groups that may be contained in the fullerene derivative include: hydrogen atoms; hydroxyl groups; halogen atoms such as fluorine atoms and chlorine atom; alkyl groups such as methyl groups and ethyl groups; alkenyl groups such as vinyl groups; cyano groups; alkoxy groups such as methoxy groups and ethoxy groups; aromatic hydrocarbon groups such as phenyl groups and naphthyl groups; and aromatic heterocyclic groups such as thienyl groups and pyridyl groups. Specific examples of functional groups include hydrogenated fullerenes such as $C_{60}H_{36}$ and $C_{70}H_{36}$, oxide fullerenes such as $C_{60}$ and $C_{70}$, and fullerene metal complexes.

Among the above mentioned derivatives, it is particularly preferable to use [6,6]-phenyl $C_{61}$ butyric acid methyl ester (60PCBM) or [6,6]-phenyl $C_{71}$ butyric acid methyl ester (70PCBM) as the fullerene derivative.

In a case where an unmodified fullerene is used, it is preferable to use $C_{70}$. This is because fullerene $C_{70}$ has a high photocarrier generation efficiency, and is suitable for use in an organic thin-film solar cell.

The blend ratio between the n-type organic semiconductor and the p-type organic semiconductor in the photoelectric conversion layer is preferably expressed as n:p=1:1 in a case where the p-type semiconductor is a P3AT-based semiconductor, and is preferably expressed as n:p=4:1 in a case where the p-type semiconductor is a PCDTBT-based semiconductor. Also, the blend ratio is preferably expressed as n:p=1:0.7 in a case where the p-type semiconductor is a PTB7-based semiconductor.

When an organic semiconductor is applied, the organic semiconductor needs to be dissolved in a solvent. Examples of the solvent to be used here include: unsaturated hydrocarbon-based solvents such as toluene, xylene, tetralin, decalin, mesitylene, n-butylbenzene, sec-butylbenzene, and tert-butylbenzene; halogenated aromatic hydrocarbon-based solvents such as chlorobenzene, dichlorobenzene, and trichlorobenzene; halogenated saturated hydrocarbon-based solvents such as carbon tetrachloride, chloroform, dichloromethane, dichloroethane, chlorobutane, bromobutane, chloropentane, chlorohexane, bromohexane, and chlorocyclohexane; and ethers such as tetrahydrofuran and tetrahydropyran. Particularly, halogen-based aromatic solvents are preferable. These solvents can be used singly or in the form of a mixture.

Alternatively, a thin-film semiconductor having an organic perovskite structure or a combination of this semiconductor and an organic thin-film semiconductor can be used as the photoelectric conversion layer.

Examples of methods for applying the solution and forming a film include spin coating, dip coating, casting, bar coating, roll coating, wire bar coating, spraying, screen printing, gravure printing, flexographic printing, offset printing, gravure offset printing, dispenser coating, nozzle coating, capillary coating, and an inkjet method. These coating methods can be used singly or in combination.

(Hole Transport Layer)

The functions of the hole transport layer is to efficiently transport holes only, and prevent disappearance of excitons generated in the vicinity of the interface with the organic active layer.

The hole transport layer may be formed with a polythiophene-based polymer such as poly(3,4-ethylenedioxythiophene)-poly(styrene sulfonate) (PEDOT/PSS), or an organic conductive polymer such as polyaniline or polypyrrole. Examples of typical polythiophene-based polymer products include Clevios PH500, CleviosPH, CleviosPV PAI 4083, and CleviosHIL1.1, which are manufactured by H.C. Starck GmbH. The hole transport layer may be formed with an inorganic material such as vanadium oxide, tungsten oxide, or molybdenum oxide.

The method of forming the hole transport layer may be any method of forming a thin film, such as a vacuum film forming method like vacuum vapor deposition or sputtering, or a sol-gel process. However, the hole transport layer may also be formed by spin coating or any kind of printing. In a case where Clevios PH500 is used as the material of the hole transport layer, the thickness of the hole transport layer is preferably 20 to 100 nm. If the hole transport layer is too thin, the effect to prevent the lower electrode from short-circuiting is lost, and short-circuiting occurs. If the hole transport layer is too thick, the film resistance becomes higher, and the generated current is restricted. As a result, the photoelectric conversion efficiency becomes lower. After the material of the hole transport layer is applied and is formed into a film having a predetermined thickness, the film is subjected to heating and drying with a hot plate or the like. The heating and drying is preferably continued at 140° C. to 200° C. for several to ten minutes. The solution to be applied in this case is preferably filtered in advance. The thickness of the hole transport layer is preferably not smaller than 1 nm and not greater than 100 nm, or more preferably, not smaller than 2 nm and not greater than 30 nm.

The positions of the electron transport layer and the hole transport layer described herein are those of a cell having an inverted structure. In a cell having a sequential structure, the positions of the electron transport layer and the hole transport layer are reversed. That is, the hole transport layer is located between the first electrode (cathode) and the organic active layer, and the electron transport layer is located between the organic active layer and the second electrode (anode).

(Second Electrode 18)

The second electrode 18 is stacked on the organic photoelectric conversion film 16. The second electrode 18 is a film of a material having electrical conductivity formed by vacuum vapor deposition, sputtering, ion plating, plating, or coating, for example. Examples of such electrode materials include conductive thin metal films and metal oxide films. In a case where the first electrode 14 is formed with a material having a high work function, the second electrode 18 is preferably formed with a material having a low work function. Examples of materials having a low work function include alkali metals and alkaline-earth metals. Specific examples of materials having a low work function include Li, In, Al, Ca, Mg, Sm, Tb, Yb, Zr, Na, K, Rb, Cs, and Ba, and alloys of these materials.

The second electrode 18 may be a single layer, or may be formed by stacking layers made of materials having different work functions. Alternatively, the second electrode 18 may be formed with an alloy of at least one of the above materials having a low work function and gold, silver, platinum, copper, manganese, titanium, cobalt, nickel, tungsten, tin, or the like. Examples of such alloys include lithium-aluminum alloy, lithium-magnesium alloy, lithium-indium alloy, magnesium-silver alloy, magnesium-indium alloy, magnesium-aluminum alloy, indium-silver alloy, and calcium-aluminum alloy.

The thickness of the second electrode 18 is 10 to 300 nm. If the thickness of the second electrode 18 is smaller than the above range, resistance becomes too high, and generated charge is not sufficiently transmitted to an external circuit. If the second electrode 18 is too thick, the formation of the first electrode 14 takes a long period of time. As a result, the material temperature becomes higher and damages the organic photoelectric conversion layer. This leads to performance degradation. Moreover, large amounts of materials are used, and therefore, the occupation time of the film formation device becomes longer, resulting in an increase in cost.

Next, an example of the first embodiment is described.

Example 1

A solar cell module according to Example 1 is the solar cell module shown in FIGS. 1 and 2, and the partition walls 12a and 12b are made of an ultraviolet curable resin.

In Example 1, the partition walls 12a and 12b are formed at the pitch of 5 mm, the thickness of each recess 12c is 2 μm, the height of the partition walls 12a and 12b from the first substrate 10 is 22 μm, and the width (a size in the transverse direction in the drawing) is 1 mm. The respective cells 2 arranged in the row direction are structurally separated from one another by the partition walls 12a and 12b. The gaps 15 shown in FIG. 1 are 200 μm in Example 1.

On the upper surface of each of the partition walls 12a and 12b, the gap between the first electrodes 14 is 100 μm, the gap between the organic photoelectric conversion films 16 is 100 μm, and the gap between the second electrodes 18 is 100 μm. With this, a no-power generating region having a total width of 300 μm is formed. That is, the aperture width (a size in the transverse direction in the drawing) of each cell is 4.7 mm. With this arrangement, it is possible to achieve the same aperture ratio as the aperture ratio of a solar cell module according to a comparative example in which the partition walls 12a and 12b are not disposed.

Although the sealing width w at the end portions of the solar cell module 1 at which the leading lines 6a and 6b are formed is 10 mm, moisture entering through the end portions is blocked by the partition walls 12a, 12b, 13a, and 13b, and thus, degradation of the cells 2 can be delayed. The resin film 19 between each of the partition walls 12a and 12b and the second substrate 20 is not greater than 1 μm in thickness or hardly exists in Example 1.

Referring now to FIGS. 6 through 12, a method of manufacturing the solar cell module 1 of Example 1 is described.

Figure 6:
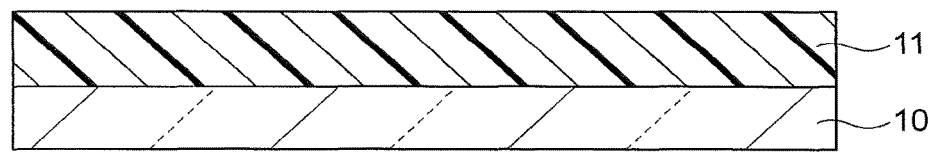
FIGS. 6 to 12 are cross-sectional diagrams showing a method of manufacturing a solar cell module of Example 1.

The transparent first substrate 10 is formed with a film. This film is manufactured by forming an ultraviolet cutting layer (not shown) on one surface of a 150-μm thick PET film of 500 mm×500 mm in size of a planar shape, and forming a stacked film (not shown) as a moisture-proof film including a silicon oxynitride layer and a silicon oxide layer on the other surface of the PET film. An ultraviolet curable resin 11 is then applied onto the surface of the first substrate 10 on which the moisture-proof film is formed (FIG. 6).

Figure 7:
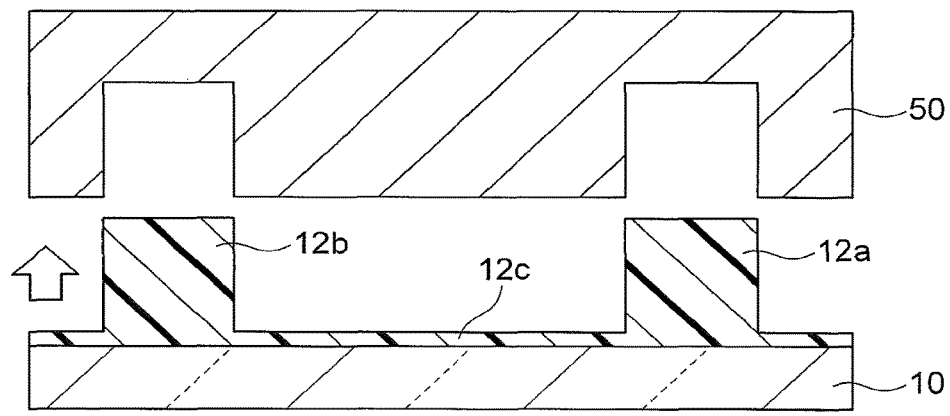

A quartz mold 50 having fine protrusions and recesses formed by machine processing in advance is pressed against the ultraviolet curable resin 11, and the ultraviolet curable resin 11 is irradiated with ultraviolet rays through the quartz mold 50. The fine protrusions and recesses are copied onto the ultraviolet curable resin 11, and the ultraviolet curable resin 11 is made to cure. The quartz mold 50 is then removed. Consequently, the resin film 11 having fine partition walls 12a and 12b each having a width of 1 mm is formed on the first substrate 10 (FIG. 7). The height of the partition walls 12a and 12b from the first substrate 10 is 22 μm, the pitch of the partition walls 12a and 12b is 5 mm, and the height of the recesses 12c is 2 μm.

Figure 8:
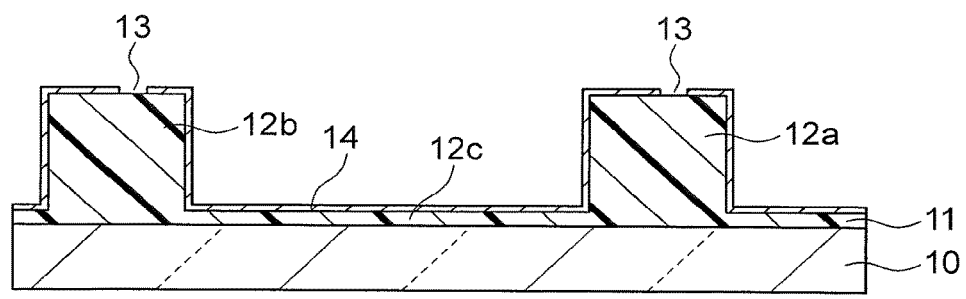

The first electrode 14 made of ITO is then formed over the first substrate 10 having the partition walls 12a and 12b, via a mask (not shown) having gaps of 0.1 mm between first electrode patterns on the partition walls 12a and 12b. In the first electrode 14 formed in this manner, gaps 13 of 0.1 mm in width are formed between adjacent cells (FIG. 8).

Figure 9:
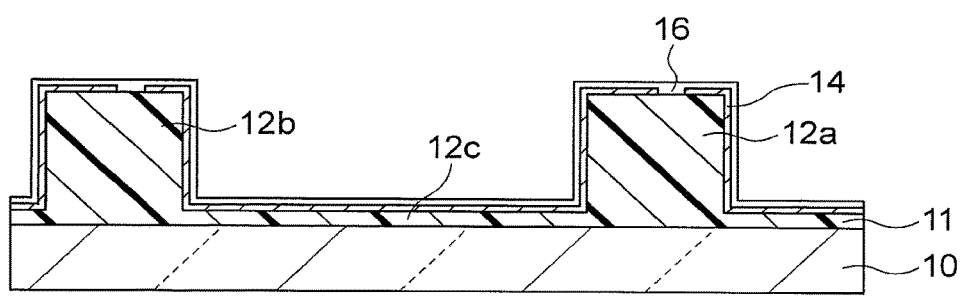

A solution in which zinc oxide is dissolved is then applied onto the first electrode 14, followed by drying, so that a 10-nm thick zinc oxide layer is formed as the electron transport layer. Consequently, the gaps 13 shown in FIG. 8 are filled with the zinc oxide layer. A mixed solution of poly(3-methylthiophene) as the p-type semiconductor material and [6,6]-phenyl $C_{71}$ butyric acid methyl ester (70PCBM) as the n-type semiconductor material is prepared at the ratio of 1:1.5 (p:n), and is then applied onto the electron transport layer via a mask (not shown) having 0.1 mm gaps between organic active layer patterns. After that, a heat treatment is performed at 90° C. for three minutes, so that an organic active layer including a 100-nm thick bulk heterojunction layer is formed. A 10-nm thick tungsten oxide film is then formed as the hole transport layer on the organic active layer by mask vapor deposition. As a result, the organic photoelectric conversion film 16 in which the electron transport layer, the organic active layer, and the hole transport layer are stacked is formed on the first electrode 14 (FIG. 9).

Figure 10:
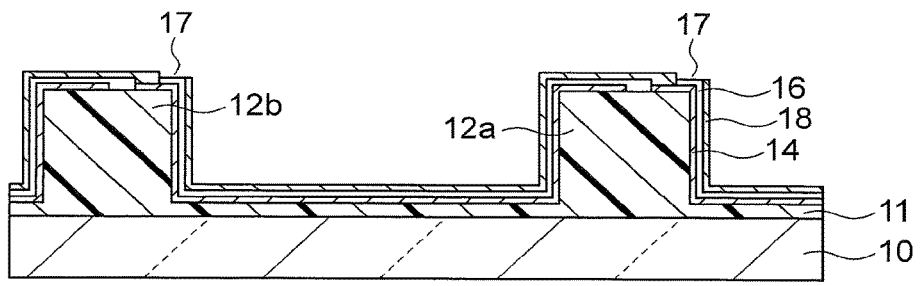

A 200-nm thick Ag film is then formed as the second electrode 18 by vacuum vapor deposition, via a mask (not shown) having 0.1 mm gaps between Ag film patterns. As a result, the second electrodes 18 of adjacent cells are separated from one another by the gaps 17 formed from the gaps on the upper surfaces of the partition walls 12a and 12b (FIG. 10).

Figure 11:
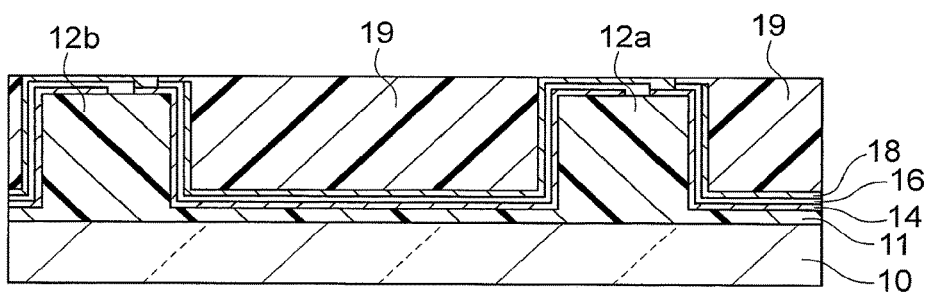
Figure 12:
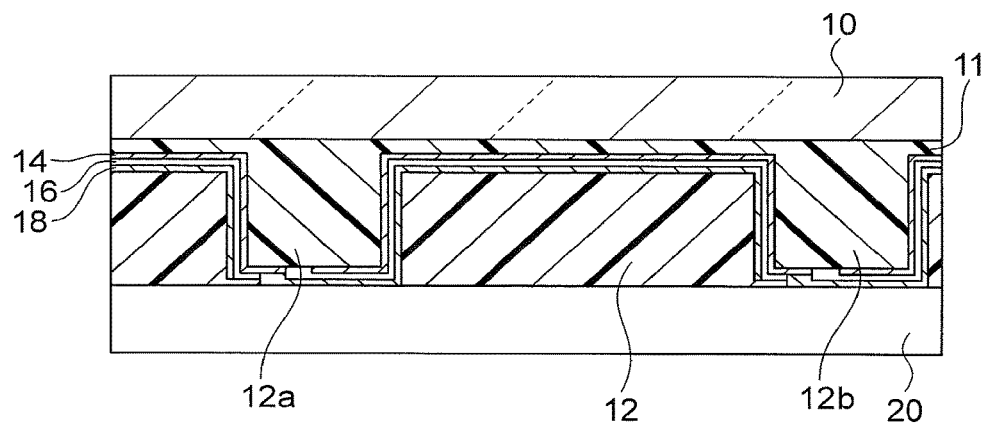

The resin film 19 serving as an adhesive is then formed by filling the recesses 12c between the partition walls 12a and 12b with silicone resin that contains a getter agent and maintains a gel-like state after curing (FIG. 11). An aluminum-deposited PET film as the second substrate 20 is then joined to the resin film 19, and a heat treatment is performed at 80° C. for one hour. As a result, the solar cell module 1 in which the cells 2 are separated from one another by the partition walls 12a and 12b is completed (FIG. 10).

In the solar cell module 1 manufactured by the above described manufacturing method, three cell arrays are formed in series in the transverse direction as shown in FIG. 1. The width (a size in the column direction in FIG. 1) of each cell array is 159.9 mm, the length (a size in the row direction) of each cell array is 480 mm, and the gaps 15 between the cell arrays are 0.2 mm. It should be noted that the electrodes 5a and 5b of the respective cell arrays, the leading lines 6a and 6b connecting the cell arrays via the electrodes 5a and 5b, and the leading electrodes 7a and 7b are formed at end portions of the module 1 shown in FIG. 1.

As shown in FIG. 2, of the pitch of 5 mm between the partition walls 12a and 12b in the length direction of the cell arrays, the no-power generating regions that do not contribute to power generation are equivalent to the gaps between the ITO patterns, the gaps between the organic photoelectric conversion films 16, and the gaps between the second electrodes 18. Consequently, the length of the aperture of each cell 2 is 4.7 mm. As for the entire solar cell module 1, FIGS. 3 and 4 show cross-sections of a right end portion and a left end portion, respectively, of each cell array in the solar cell module shown in FIG. 2.

Figure 3:
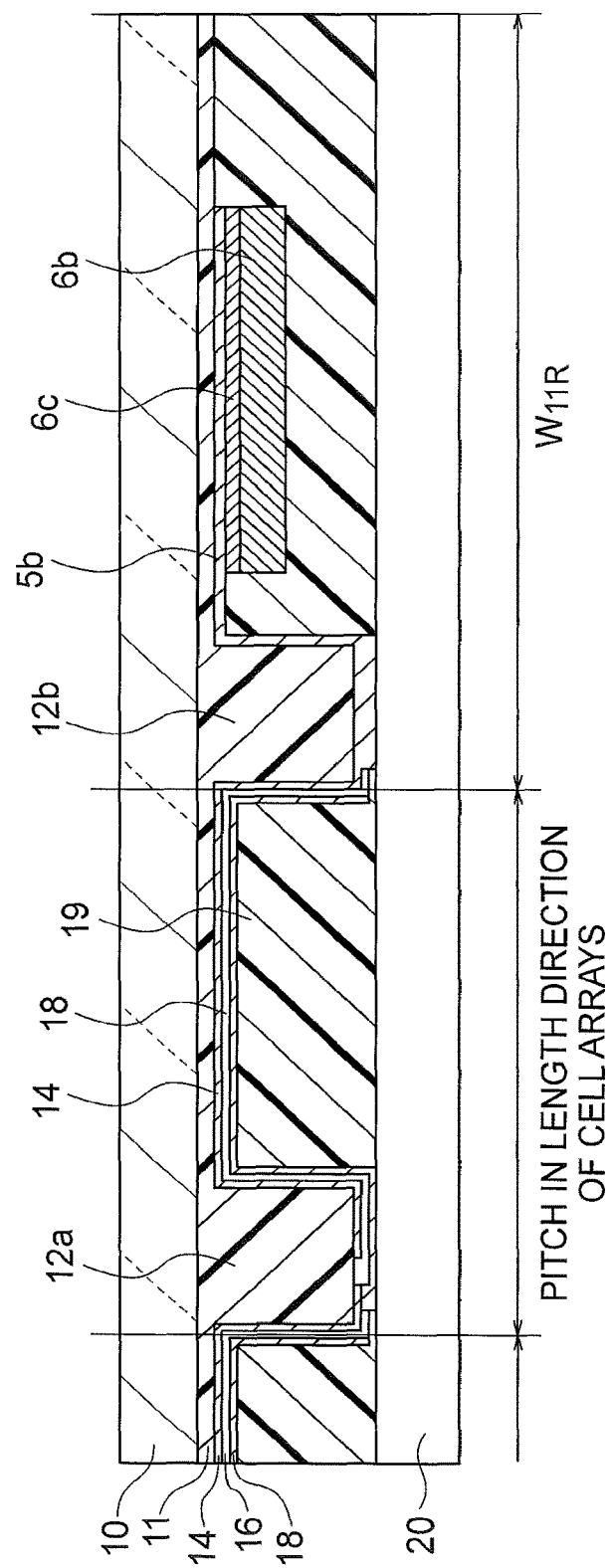
FIG. 3 is a cross-sectional view of a right end portion of a cell array of the first embodiment.
Figure 4:
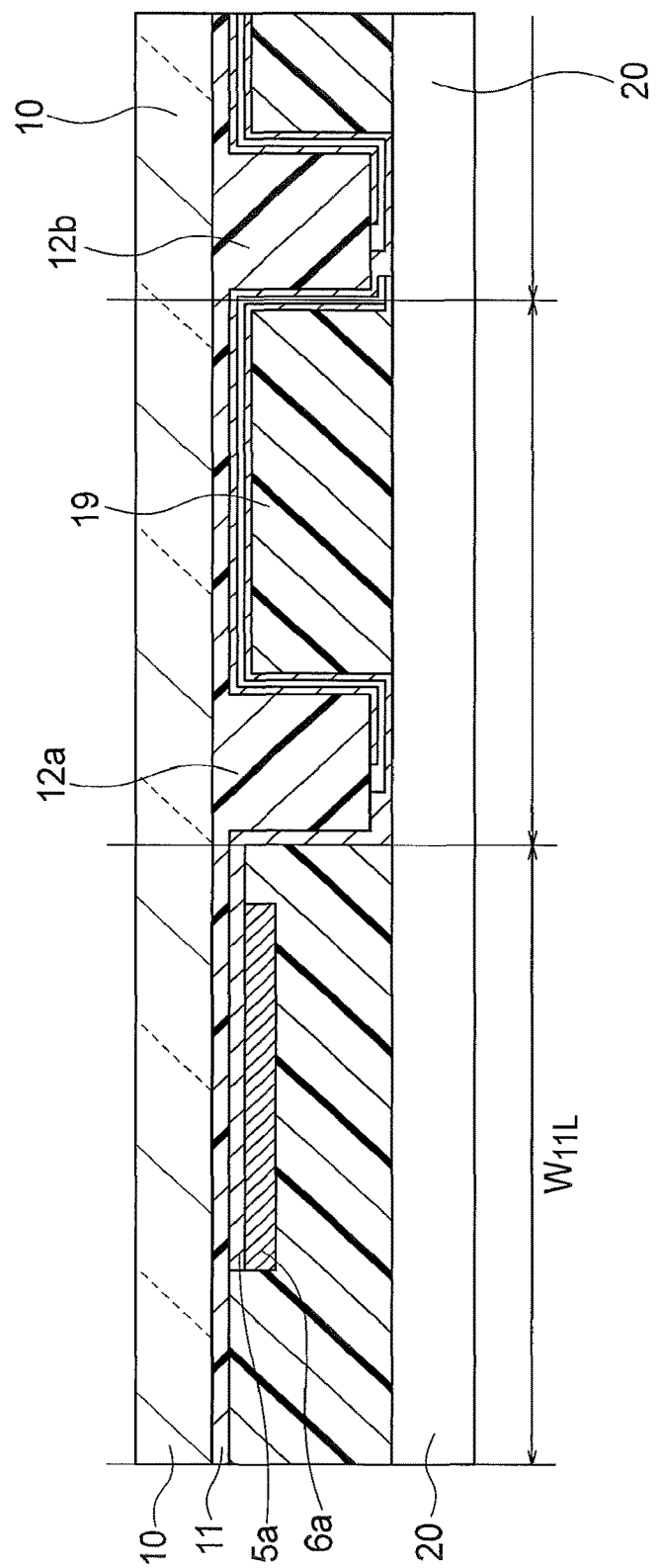
FIG. 4 is a cross-sectional view of a left end portion of a cell array of the first embodiment.

As shown in FIG. 3, the right end portion includes the no-power generating region of the rightmost partition wall 12b, and has a sealing width $W_{11R}$ of 10 mm. As shown in FIG. 4, the left end portion does not include the leftmost partition wall 12a, and has a sealing width $W_{11L}$ of 10 mm. As shown in FIG. 3, in a case where the cell array electrode 5b is made of ITO, an interconnect 6c made of aluminum (Al), for example, is preferably disposed between the cell array electrode 5b and the leading line 6b.

As for upper and lower end portions of the solar cell module shown in FIG. 2, both the upper and lower end portions include the partition walls 13a and 13b, have a width $W_{12}$ of 10 mm, and have a power generating region of approximately 480 square mm, excluding the end portions. It should be noted that the no-power generating regions on the partition walls 12a and 12b are excluded. The partition walls 13a and 13b formed at the outermost cell arrays in the row direction are insulated by Cu oxide films formed on the surfaces of the plating patterns, and therefore, do not contribute to power generation. Alternatively, the partition walls 13a and 13b may be formed simultaneously in the step of copying the fine protrusions and recesses onto the UV curable resin layer during the process of forming the partition walls 12a and 12b, as will be described later. In this case, a power generating element should not be disposed on each of the partition walls 13a and 13b.

A durability test was conducted on the solar cell module 1. As a result, moisture infiltration was prevented, though the sealing width at the end portions was as small as 10 mm. Thus, a high durability was achieved.

Even if moisture infiltrates through end portions, the infiltrating moisture can be trapped by the cells 2 close to the end portions, since the cells 2 are separated from one another by the partition walls 12a and 12b, and the cells 2 are filled with the resin film 19 serving as a gel-like adhesive containing a getter agent. Because of this, any degraded region of the organic active layers did not spread.

Furthermore, a solar cell module that exhibited a high strength against bending and a high reliability when subjected to deformation was obtained, since the first and second substrates 10 and 20 were supported by the partition walls 12a and 12b in the solar cell module 1.

Figure 13:
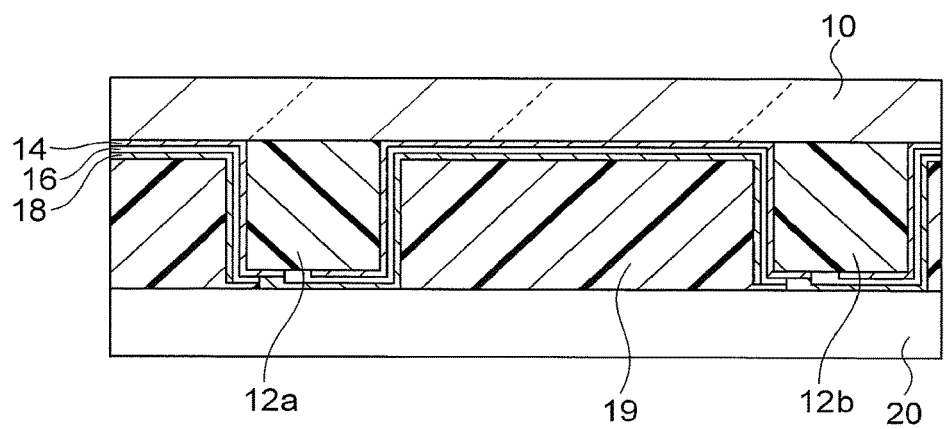
FIG. 13 is a cross-sectional view of a cell of a solar cell module according to a modification of Example 1.

In Example 1, the partition walls are formed with UV curable resin layers having fine protrusions and recesses on the first substrate 10. However, in the step shown in FIG. 7, the quartz mold 50 may be pressed against the applied UV curable resin 11 until the protrusions of the quartz mold 50 is brought into tight contact with the first substrate 10. As a result, a solar cell module that has no resin in the recesses 12c between the partition walls 12a and 12b can be obtained (FIG. 13).

Such a solar cell module having no resin in the recesses 12c can achieve a high reliability, like the solar cell module of Example 1.

As described above, the first embodiment can provide a solar cell module that is capable of preventing the no-power generating regions from expanding, and preventing decreases in durability.

In the first embodiment illustrated in FIG. 2, the first substrate serving as the light irradiation surface is the outermost layer. However, the same effects as above can be achieved even in a case where optical components for optical management such as a light guide panel or a microlens array layer are formed outside the outermost layer.

Second Embodiment

Figure 14:
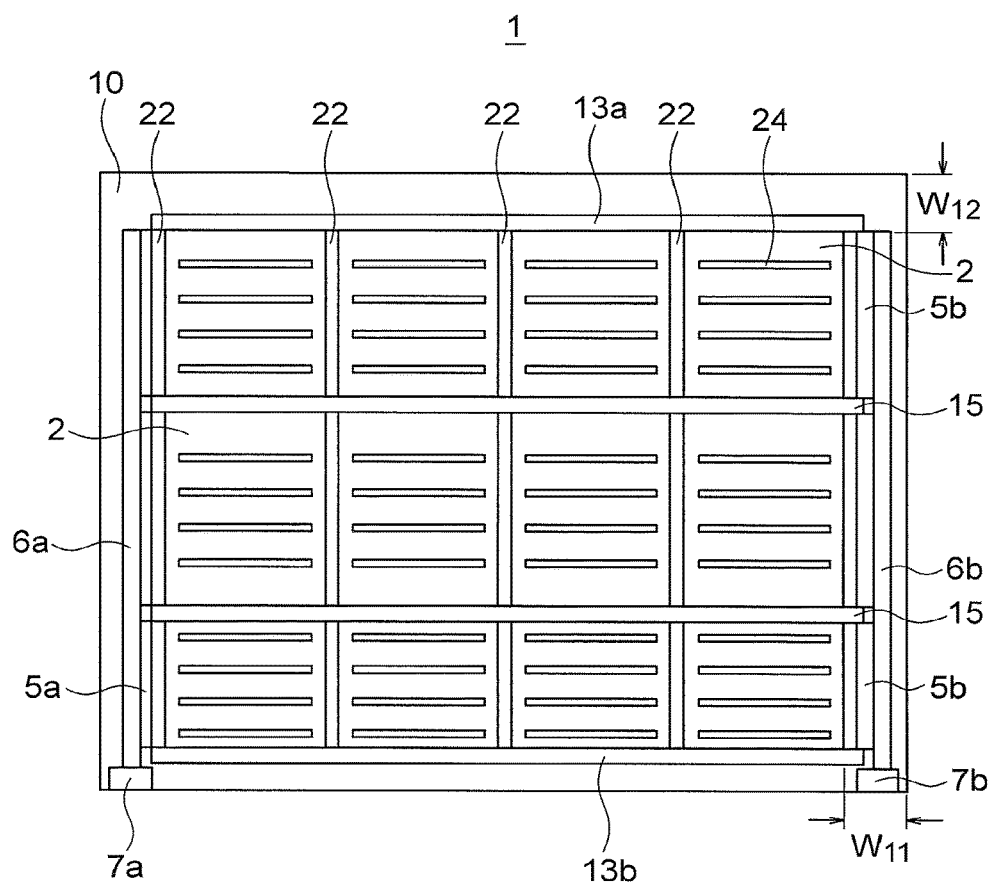
FIG. 14 is a plan view of a solar cell module according to a second embodiment.

FIG. 14 is a plan view of a solar cell module according to a second embodiment. The solar cell module according to this embodiment includes cells 2 arranged in an array. FIG. 14 shows the cells 2 arranged in three rows and four columns. The cells 2 in the same row are connected in series. Electrodes 5a and 5b are disposed at the two ends of the row of the series-connected cells 2, and these electrodes 5a and 5b are connected to leading lines 6a and 6b, respectively. These leading lines 6a and 6b are connected to leading electrodes 7a and 7b. That is, the charges obtained by photoelectric conversion at the respective cells are output to the outside via the electrodes 5a and 5b, the leading lines 6a and 6b, and the leading electrodes 7a and 7b. A gap 15 is disposed between each two adjacent rows.

Protruding partition walls 22 are disposed at the two ends of each cell 2 in the row direction. Partition walls 13a and 13b shared among the respective columns are disposed at the two ends of each column of aligned cells 2.

Figure 15:
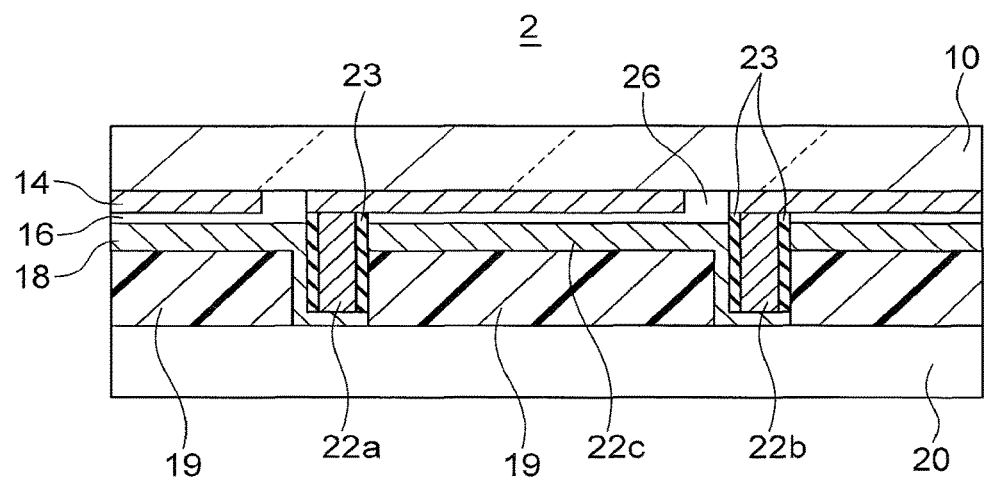
FIG. 15 is a cross-sectional view of a cell of the solar cell module of the second embodiment.

FIG. 15 is a cross-sectional view of a cell 2, taken along a plane parallel to the row direction of the cells 2. The solar cell module 1 of this embodiment is disposed between a transparent first substrate 10 and a second substrate 20. This solar cell module 1 is disposed on the first substrate 10, and includes the cells 2 connected in series. Each of the cells 2 includes protruding conductive partition walls 22a and 22b disposed at the two ends of the cell, a recess 22c formed between the partition walls 22a and 22b, insulating layers 23 disposed on the side surfaces of the partition walls 22a and 22b, a transparent first electrode 14 disposed on the recess 22c, an organic photoelectric conversion film 16 disposed on the first electrode 14, a second electrode 18 disposed on the organic photoelectric conversion film 16, and a resin film 19 that is disposed on the second electrode 18 in the recess 22c and serves as an adhesive. The second electrode 18 is also disposed on one side surface and the upper surface of each insulating layer 23. With this, the first electrode 14 of each cell 2 is connected to the second electrode 18 of the previous cell 2 via the conductive partition wall 22a. That is, the cells 2 arranged in the same row are connected in series.

At least one auxiliary electrode 24 is disposed on the upper surface of the first electrode 14 in the recess 22c of each cell 2 (FIG. 14). This auxiliary electrode 24 is designed to extend in the row direction, and is disposed to lower the resistance of the first electrode 14 of each cell. FIG. 14 shows a state in which the organic photoelectric conversion films 16 and the second electrodes 18 are not formed on the first electrodes 14.

The partition walls 22a and 22b are shared between the adjacent cells 2, and serve as the partition walls 22 shown in FIG. 14. A gap 26 is disposed on the recess of each cell 2, so that the first electrodes of each two adjacent cells 2 are not connected. In the second embodiment, the gap 26 is filled with the organic photoelectric conversion film 16. The gap 26 may be filled with an insulating resin.

The organic photoelectric conversion film 16 has the same structure and is formed with the same materials as the organic photoelectric conversion film 16 described in the first embodiment.

The organic photoelectric conversion films 16 of each two adjacent cells 2 are separated by the corresponding partition wall 22 and the corresponding insulating layer 23, and the second electrodes 18 are separated by the other side surface of the corresponding partition wall 22a.

In this embodiment, the resin film 19 serving as an adhesive is formed on the second electrode 18 in the recess 22c. The second substrate 20 is disposed on the resin film 19.

Referring now to FIGS. 18 through 23, a method of manufacturing the solar cell module 1 of the second embodiment is described.

Figure 18:
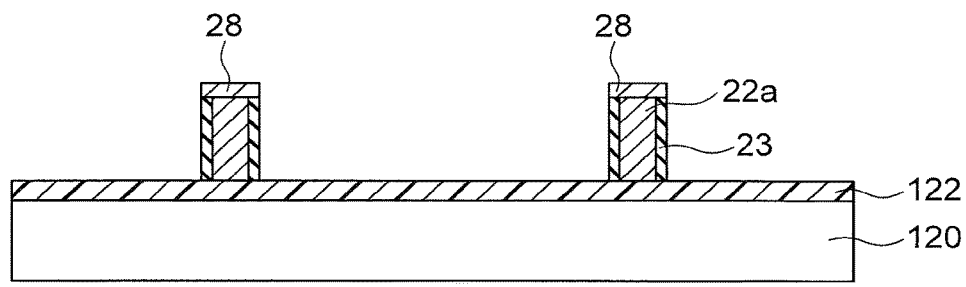
FIGS. 18 to 23 are cross-sectional diagrams showing a method of manufacturing the solar cell module of the second embodiment.

First, a supporting substrate 120 is prepared. The supporting substrate 120 has a surface to which an adhesive layer 122 is applied. A Pd pattern film is formed by vapor deposition on the adhesive layer 122 of the supporting substrate 120 via a mask, and the supporting substrate 120 is immersed in an electroless Cu plating solution, so that 10-μm high Cu plating patterns to be the partition walls 22a and 22b are formed in the regions corresponding to the Pd deposition patterns. A 1-μm thick Ag paste film is then formed as a conductive paste film 28 on each of the plating patterns 22a and 22b by printing, and a heat treatment is performed at 120° C. in a furnace in an oxygen atmosphere for ten minutes, so that insulating layers 23 made of copper oxide are formed on surfaces of the Cu plating patterns 22a and 22b (FIG. 18). The adhesive layer 122 on the supporting substrate 120 is an adhesive that reduces its adhesiveness when heated. The above described heat treatment conditions are enough for forming the insulating layers 23 on the Cu surface layers. However, the Ag paste films 28 are not hardened, and at this point of time, the Ag paste films 28 are in a partially-hardened state, still having adhesiveness.

The transparent first substrate 10 is then formed with a film. This film is manufactured by forming an ultraviolet cutting layer (not shown) on one surface of a 150-μm thick PET film of 500 mm×500 mm in size of a planar shape, and forming a stacked film (not shown) as a moisture-proof film containing SiON and $SiO_2$ on the other surface of the PET film.

ITO patterns to be the first electrodes 14 are then formed by vapor deposition with a mask on the surface of the first substrate 10 on which the moisture-proof film is formed. At this point of time, gaps 26 having a width (a length in the row direction) of 0.2 mm are formed in regions in the vicinities of the partition walls 22a and 22b, to separate the first electrodes 14 of adjacent cells from each other.

Figure 19:
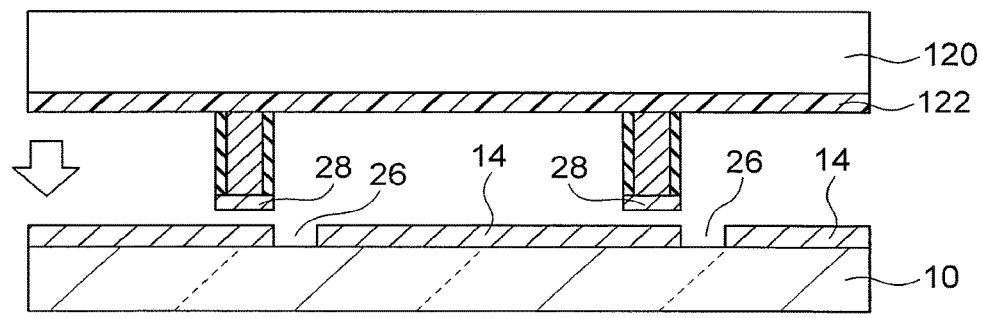

The first substrate on which the first electrodes 14 are formed and the supporting substrate 120 on which the partition walls 22a and 22b are formed are joined to each other, so that the conductive paste films 28 face the first electrodes 14 (FIG. 19).

Figure 20:
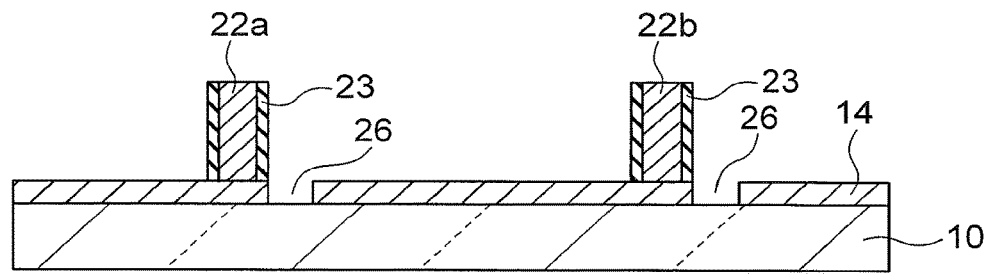

The supporting substrate 120 is then removed on a hot plate at 90° C. As a result, the partition walls 22a and 22b are copied onto the first substrate 10 by virtue of the adhesiveness of the conductive paste films 28 in a partially-hardened state. The first substrate 10 is then subjected to a heat treatment for 30 minutes on a hot plate at 120° C., so that the Ag paste films 28 are hardened. Consequently, the partition walls 22a and 22b having fine protrusions are formed on the first substrate 10 (FIG. 20). The width (a length in the row direction) of the partition walls 22a and 22b is 0.4 mm, the height of the partition walls 22a and 22b from the first electrodes 14 is approximately 10 µm, and the pitch of the partition walls 22a and 22b is 5 mm.

Figure 21:
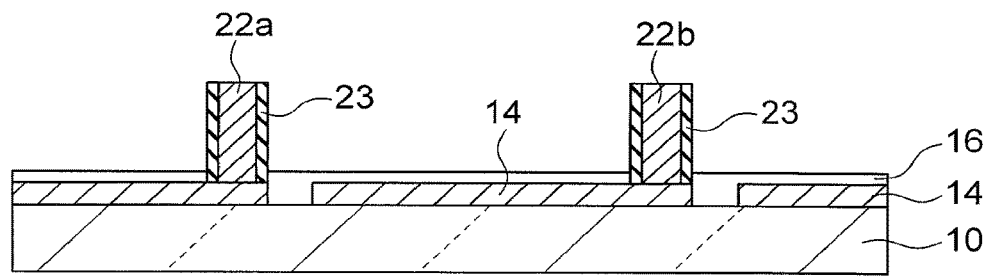

On the first substrate 10 having the partition walls 22a and 22b formed thereon, a solution in which zinc oxide is dissolved is then applied onto the regions other than the partition walls 22a and 22b on the first electrode 14, followed by drying, so that a 10-nm thick zinc oxide layer is formed as the electron transport layer. A mixed solution of poly(3-methylthiophene) as the p-type semiconductor material and [6,6]-phenyl $C_{71}$ butyric acid methyl ester (70PCBM) as the n-type semiconductor material is prepared at the ratio of 1:1.5 (p:n), and is then applied onto the regions other than the partition walls 22a and 22b. After that, a heat treatment is performed at 90° C. for three minutes, to form a 100-nm thick organic active layer. Further, a 10-nm thick tungsten oxide layer is formed as the hole transport layer on the organic active layer by vapor deposition with a mask. As a result, the organic photoelectric conversion film 16 is formed on each first electrode 14 (FIG. 21). The gaps 26 for separating the first electrodes 14 of adjacent cells 2 are filled with the organic photoelectric conversion films 16.

Figure 22:
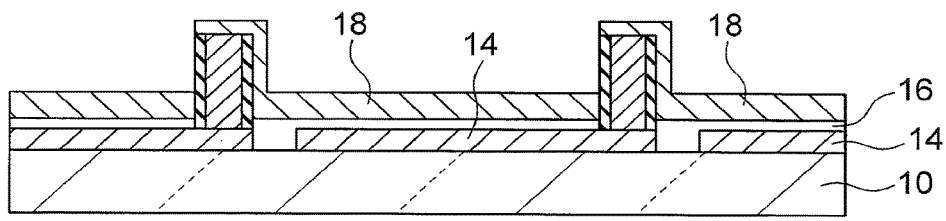

A 200-nm thick Ag film is then deposited with a mask, so that Ag film patterns are formed as the second electrodes 18 (FIG. 22).

Figure 23:
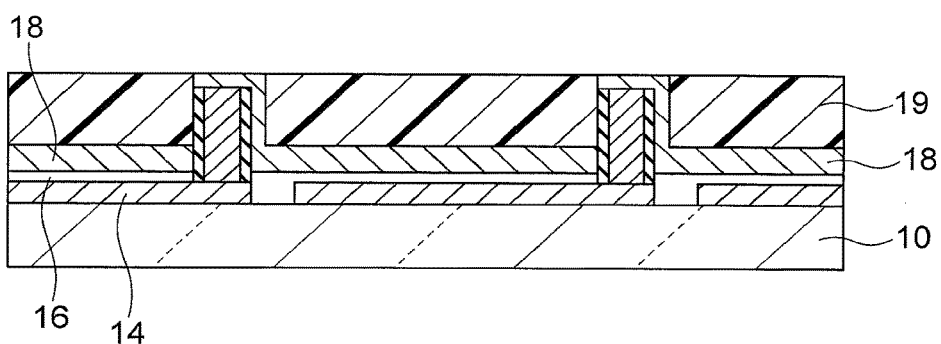

The resin film 19 serving as an adhesive is then formed by filling the recesses 22c between the partition walls 22a and 22b with silicone resin that contains a getter agent and maintains a gel-like state after curing (FIG. 23). An aluminum-deposited PET film to be the second substrate 20 is joined to the resin film 19. A heat treatment is then performed at 80° C. for one hour, so that the solar cell module 1 in which the cells 2 are separated from one another by the partition walls 22a and 22b as shown in FIGS. 14 and 15 is completed.

In the 500 mm×500 mm solar cell module manufactured by the above described manufacturing method, three cell arrays are formed in series in the transverse direction (row direction) as shown in FIG. 14. The width (a size in the column direction) of each cell array is 159.9 mm, the length (a size in the row direction) of each cell array is 480 mm, and the gaps 15 between the cell arrays are 0.2 mm in size.

As shown in FIG. 15, of the pitch P of 5 mm between the partition walls 22a and 22b in the length direction of the cell array, the no-power generating region that does not contribute to power generation occupies 0.2 mm, which is the size of the gap 15 between the first electrodes of adjacent cells 2, and 0.4 mm, which is the width of each of the partition walls 22a and 22b (including the thickness of the insulating layer 23). That is, the length of the aperture of each cell 2 is 4.4 mm (=5−(0.2+0.4)).

The partition walls 13a and 13b formed at the outermost cell arrays in the row direction are insulated by Cu oxide films formed on the surfaces of the plating patterns, and therefore, do not contribute to power generation.

Figure 16:
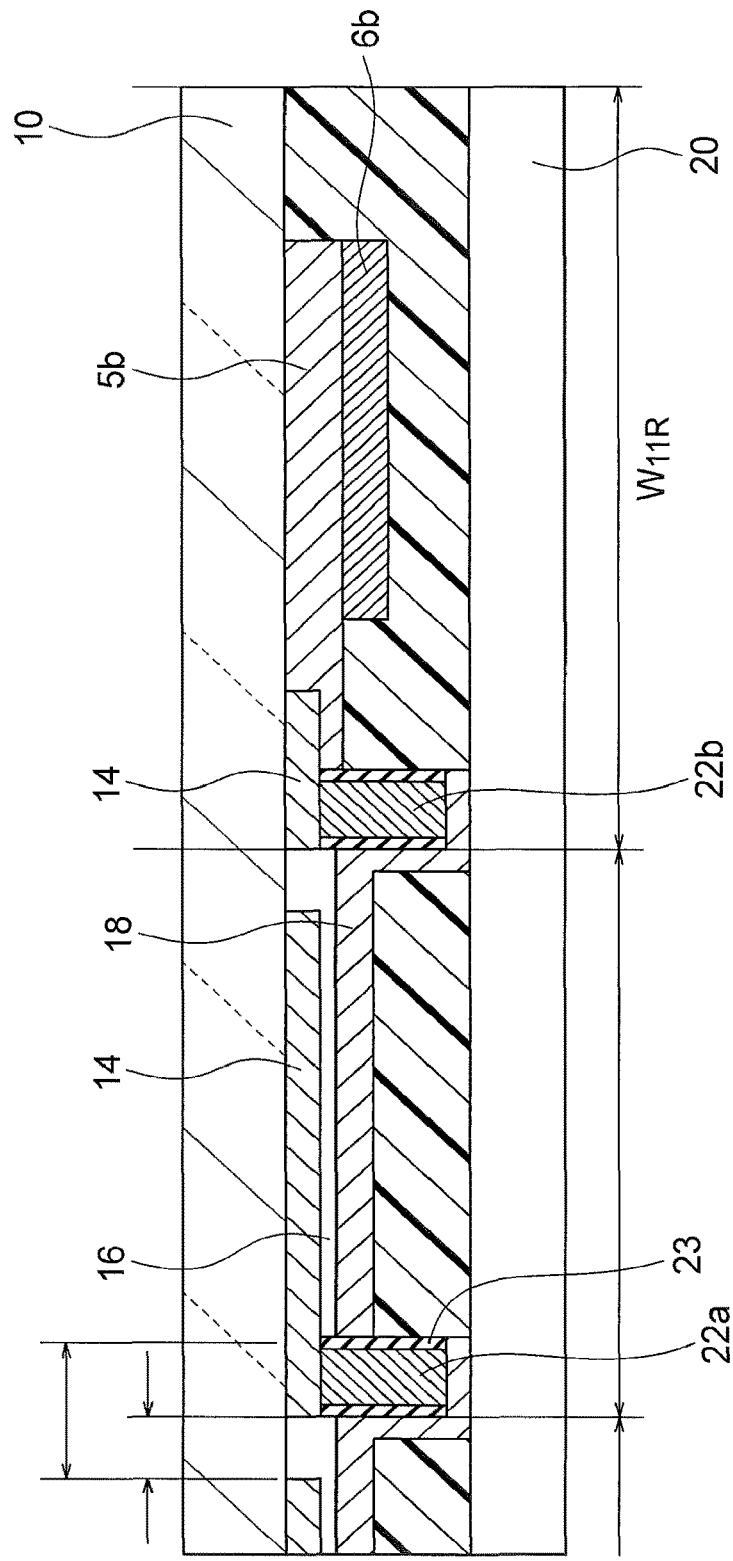
FIG. 16 is a cross-sectional view of a right end portion of a cell array of the second embodiment.
Figure 17:
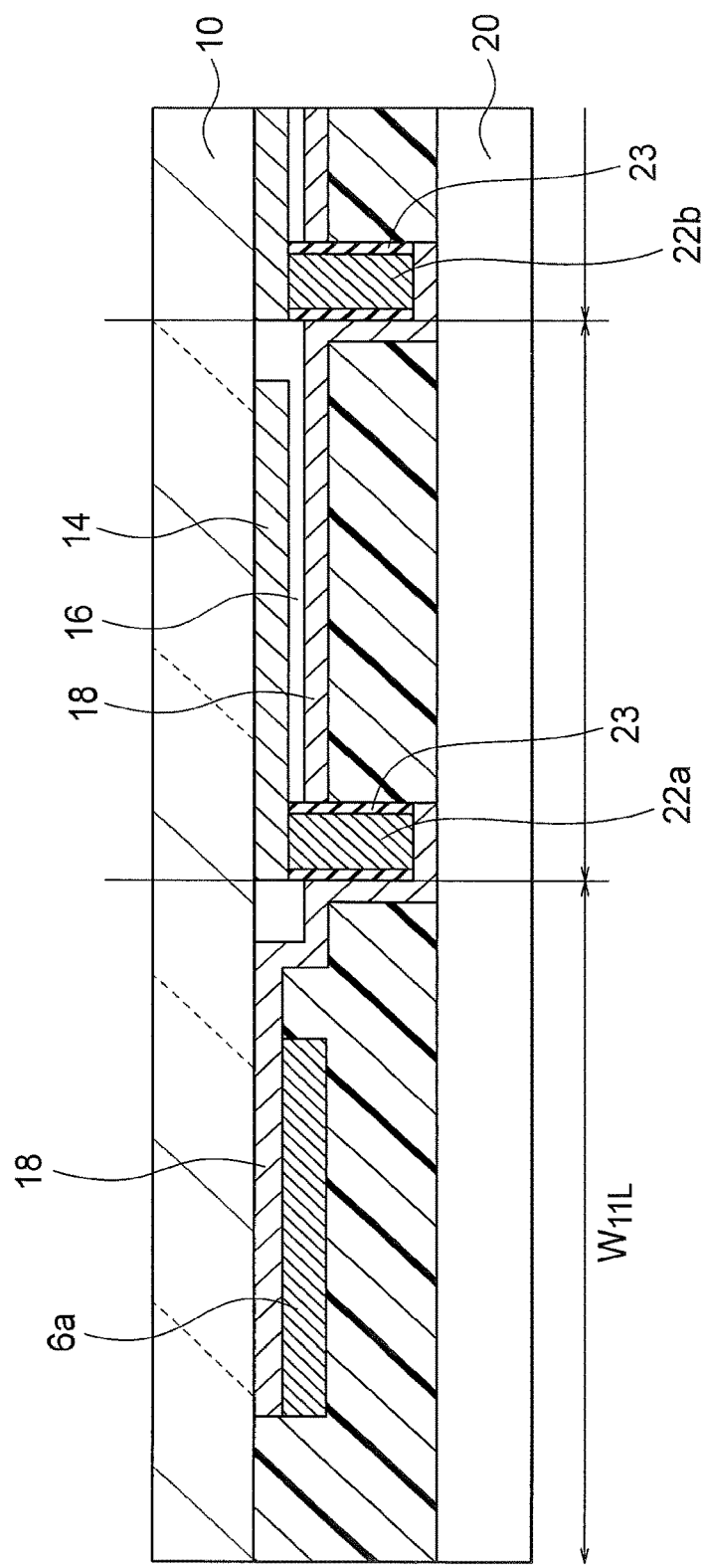
FIG. 17 is a cross-sectional view of a left end portion of a cell array of the second embodiment.

As for the entire solar cell module 1, FIGS. 16 and 17 show cross-sections of a right end portion and a left end portion, respectively, of each cell array in the solar cell module shown in FIG. 14. As shown in FIG. 16, the right end portion includes the rightmost partition wall 22b, and has a sealing width $W_{11R}$ of 10 mm. As shown in FIG. 17, the left end portion does not include the leftmost partition wall 22a, and has a sealing width $W_{11L}$ of 10 mm. As for upper and lower end portions in FIG. 14, both the upper and lower end portions include the partition walls 13a and 13b, have a sealing width $W_{12}$ of 10 mm, and have a power generating region in a square shape of approximately 480 square mm, excluding the end portions.

A durability test was conducted on the solar cell module 1. As a result, moisture infiltration was prevented, though the sealing width at the end portions was as small as 10 mm. Thus, a high durability was achieved. Even if moisture infiltrates through end portions, the infiltrating moisture can be trapped by the cells close to the end portions, since the cells are separated from one another by the partition walls 22a and 22b, and the cells are filled with the resin film 19 serving as a gel-like adhesive containing a getter agent. Because of this, any degraded region of the organic active layers did not spread.

Furthermore, a solar cell module that exhibited a high strength against bending and a high reliability when subjected to deformation was obtained, since the first and second substrates were supported by the partition walls 22a and 22b in the solar cell module 1.

Further, as the conductive partition walls 22a and 22b were formed locally on the first electrodes 14, the resistance of the first electrodes 14 became lower, and power generation efficiency became higher. In addition to that, not only the partition walls 22a and 22b but also plating patterns are formed as the auxiliary electrodes 24 on the first electrodes 14 in the same direction as the longitudinal direction of the power generation array, as shown in FIG. 14. This arrangement lowers the resistance of the first electrodes 14. The auxiliary electrodes 24 can be formed at the same time as the formation of the plating patterns on the supporting substrate 120 shown in FIG. 18. Thus, the resistance of the first electrodes 14 can be lowered, without any additional process.

In the second embodiment, the partition walls 22a and 22b are made of copper (Cu).

Alternatively, the partition walls 22a and 22b may be made of at least one metal selected from the group consisting of Cu, aluminum (Al), silver (Ag), and gold (Au).

As described above, the second embodiment can provide a solar cell module that is capable of preventing the no-power generating regions from expanding, and preventing decreases in durability.

Third Embodiment

A solar cell module according to a third embodiment is now described. The solar cell module of the third embodiment is the same as the solar cell module 1 of the first embodiment shown in FIGS. 1 and 2, except that the partition walls 12a and 12b is formed with a resin that has a high transmittance in the visible light region, and contains a wavelength conversion material that absorbs ultraviolet light and emits long-wavelength light.

Figure 24:
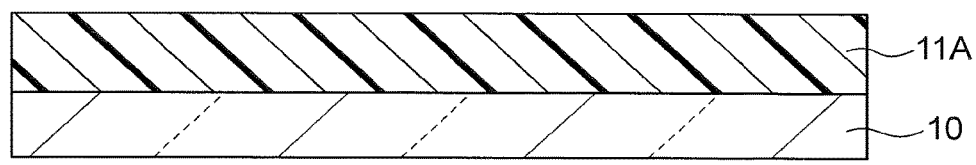
FIGS. 24 and 25 are cross-sectional diagrams showing a method of manufacturing the solar cell module of a third embodiment.
Figure 25:
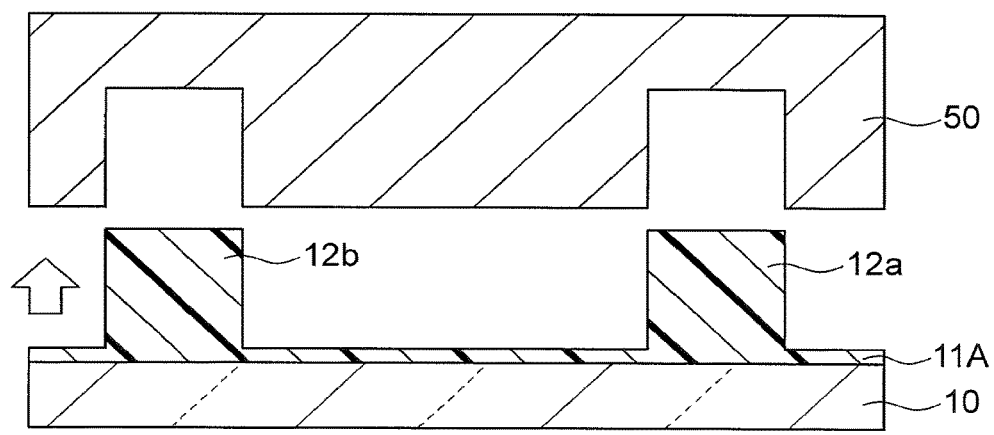

Referring now to FIGS. 24 and 25, a method of manufacturing the solar cell module 1 of the third embodiment is described.

First, a PET film having a light transmittance of 90% or higher in the 380 nm to 800 nm wavelength regions is used as the transparent first substrate 10. Epoxy resin 11A that has a light transmittance of 88% or higher at wavelengths of 380 nm to 800 nm is applied onto the first substrate 10 (FIG. 24). The epoxy resin 11A contains a pigment or a fluorescent material that absorbs ultraviolet rays at 320 nm to 380 nm and converts the ultraviolet rays into light in a wavelength region at 380 nm or longer. A metal mold 50 that has fine protrusions and recesses formed by machine processing in advance is pressed against the epoxy resin 11A, and the pressed state is maintained at 100° C. for ten minutes, so that the fine protrusions and recesses are copied onto the epoxy resin 11A. After curing of the epoxy resin 11A, the metal mold 50 is removed (FIG. 25). As a result, a resin film 11A having the fine partition walls 12a and 12b each having a width of 20 μm is formed on the first substrate 10. The height of the partition walls 12a and 12b from the first substrate 10 is 25 μm, and the pitch of the partition walls 12a and 12b is 50 μm. At this point of time, the height of the resin film 11A in the recesses 12c from the first substrate 10 is 5 μm.

On the first substrate 10 having the partition walls 12a and 12b formed thereon, the first electrodes 14 and the organic photoelectric conversion films 16 are formed by the same process as that shown in FIGS. 8 through 12, which have been described in Example 1 of the first embodiment. The first electrodes 14 have a thickness of 300 nm and are made of ITO. The organic photoelectric conversion films 16 each include: a 10-nm thick zinc oxide layer as the electron transport layer; a 100-nm thick organic active layer formed by mixing poly(3-methylthiophene) as the p-type semiconductor material and [6,6]-phenyl $C_{61}$ butyric acid methyl ester (60PCBM) as the n-type semiconductor material at a ratio of 1:2 (p:n); and a 10-nm thick vanadium oxide layer as the hole transport layer. On the organic photoelectric conversion films 16, 200-nm thick Ag films are formed as the second electrodes 18.

Further, the recesses 12c between the partition walls 12a and 12b are filled with an epoxy resin film 19 containing a desiccant material. An aluminum-deposited PET film to be the second substrate 20 is joined to the resin film 19. A heat treatment is then performed at 80° C. for one hour, so that the solar cell module 1 in which the cells are separated from one another by the partition walls 12a and 12b is completed.

A durability test was conducted on the solar cell module manufactured by the above described manufacturing method. The sealing width and region at the end portions were small, and the sealing height between the first substrate 10 and the second substrate 20 was as small as 25 μm. Despite these aspects, moisture infiltration through the end portions was prevented, and a high durability was achieved. As the partition walls 12a and 12b were made of a resin material containing a wavelength conversion material, the photoelectric conversion efficiency was increased approximately 2%, compared with the photoelectric conversion efficiency of a solar cell module of a comparative example that does not use any resin material containing a wavelength conversion material. Degradation of the organic active layers due to continuous light irradiation was also reduced. Thus, a highly reliable solar cell module was obtained.

Like the first embodiment, the third embodiment can provide a solar cell module that is capable of preventing the no-power generating regions from expanding, and preventing decreases in durability.

Fourth Embodiment

Figure 26:
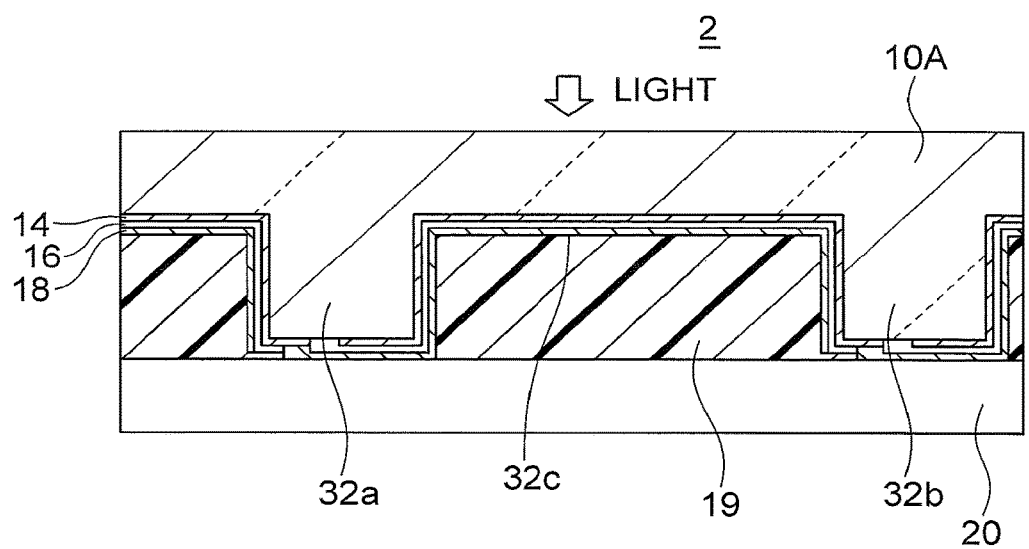
FIG. 26 is a cross-sectional view of a cell of a solar cell module according to a fourth embodiment.
Figure 27:
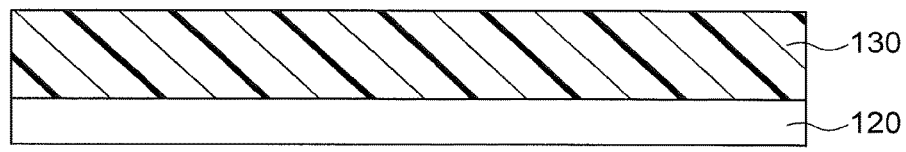
FIGS. 27 and 28 are cross-sectional diagrams showing a method of manufacturing the solar cell module according to the fourth embodiment.
Figure 28:
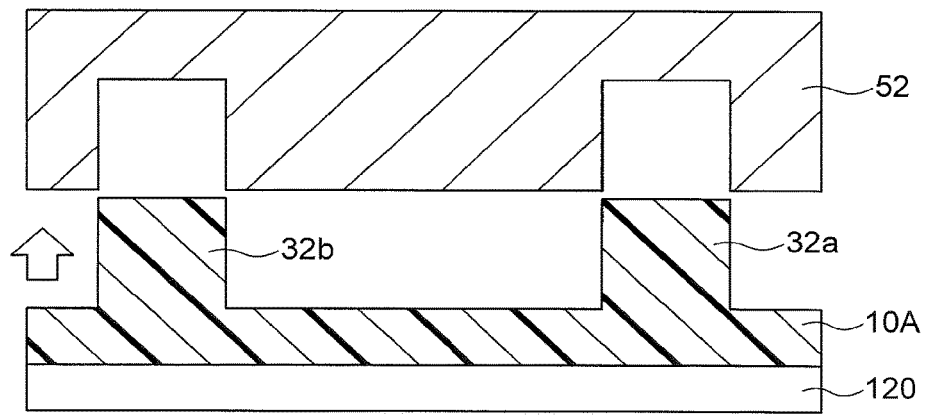

Referring now to FIGS. 26 through 28, a solar cell module according to a fourth embodiment is described. The solar cell module of the fourth embodiment differs from the solar cell module of the first embodiment shown in FIGS. 1 and 2, in that the first substrate 10 and the resin film 11 forming the partition walls 12a and 12b are made of the same material. Other than that, the solar cell module of the fourth embodiment has the same structure as solar cell module of the first embodiment. That is, in the solar cell module of the fourth embodiment, cell arrays each including cells connected in series are arranged in the column direction, as shown in FIG. 1.

FIG. 26 shows a cross-section of a cell 2 of the solar cell module of the fourth embodiment. Each cell 2 is formed on a transparent first substrate 10A having a surface on which recesses 32c between partition walls 32a and 32b are formed. Each recess 32c has protruding partition walls 32a and 32b at both ends thereof.

The solar cell module of the fourth embodiment is disposed between the transparent first substrate 10A and a second substrate 20. This solar cell module 1 is disposed on the first substrate 10A, and includes cells 2 connected in series. Each of the cells 2 includes a transparent first electrode 14 disposed on the upper and side surfaces of the partition walls 32a and 32b and on the recess 32c, an organic photoelectric conversion film 16 disposed on the first electrode 14, a second electrode 18 disposed on the organic photoelectric conversion film 16, and a resin film 19 that is disposed on the second electrode 18 in the recess 32c and serves as an adhesive.

Referring now to FIGS. 27 and 28, a method of manufacturing the solar cell module of the fourth embodiment is described.

First, a metal mold 50 having fine protrusions and recesses formed in advance is prepared. A 125-μm thick polycarbonate (PC) resin film 130 formed on a supporting substrate 120 heated to 180° C. is prepared (FIG. 27). The metal mold 50 heated to 180° C. is pressed against the PC resin film 130 for 10 seconds, so that the fine protrusions and recesses of the metal mold 50 are copied onto the surface of the PC resin film 130 (FIG. 28). As a result, the first substrate 10A having the fine protruding partition walls 32a and 32b having a width of 20 μm is formed in the surface of the PC resin film 130 (FIG. 28). The height of the partition walls 32a and 32b is 8 μm, and the pitch of the partition walls 32a and 32b is 100 μm. After that, the supporting substrate 120 is removed from the first substrate 10A.

An ultraviolet cutting layer (not shown) is then formed on the flat surface of the first substrate 10A by vacuum film formation. By the same process as the process according to the manufacturing method described in the third embodiment, ITO patterns to be the first electrodes 14 of 300 nm in thickness are then formed on the surface having the partition walls 32a and 32b formed thereon. The organic photoelectric conversion films 16 are formed on the first electrodes 14. The organic photoelectric conversion films 16 each include: a 10-nm thick zinc oxide layer as the electron transport layer; a 100-nm thick organic active layer formed by mixing poly(3-methylthiophene) as the p-type semiconductor material and [6,6]-phenyl $C_{61}$ butyric acid methyl ester (60PCBM) as the n-type semiconductor material at a ratio of 1:2 (p:n); and a 10-nm thick vanadium oxide layer as the hole transport layer. Ag films of 200 nm in thickness are then formed as the second electrodes 18. Further, the recesses 32c between the partition walls 32a and 32b are filled with an epoxy resin film 19 containing a desiccant material. An aluminum-deposited PET film to be the second substrate 20 is joined to the epoxy resin film 19. A heat treatment is then performed at 80° C. for one hour, so that the solar cell module in which the cells 2 are separated from one another by the partition walls 32a and 32b is completed.

A durability test was conducted on the solar cell module manufactured by the above described manufacturing method. The sealing width and region at the end portions were small, and the sealing height between the first substrate 10A and the second substrate 20 was as small as approximately 8 µm. Despite these aspects, moisture infiltration through the end portions was prevented, and a high durability was achieved.

Like the third embodiment, the fourth embodiment can provide a solar cell module that is capable of preventing the no-power generating regions from expanding, and preventing decreases in durability.

Fifth Embodiment

A solar cell module according to a fifth embodiment is now described. The solar cell module of the fifth embodiment differs from the solar cell module of the first embodiment shown in FIGS. 1 and 2, in that the resin film 11 forming the partition walls 12a and 12b is a transparent resin film having a high refractive index. Except for the transparent resin film having a high refractive index, the solar cell module of the fifth embodiment has the same structure as the solar cell module of the first embodiment.

Figure 29:
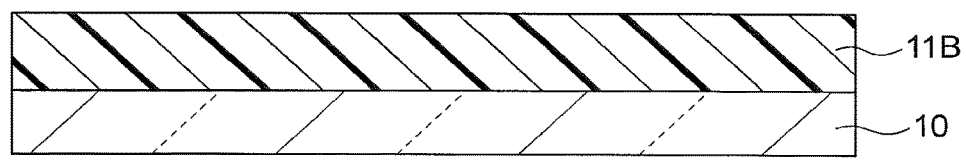
FIGS. 29 and 30 are cross-sectional diagrams showing a method of manufacturing the solar cell module according to a fifth embodiment.
Figure 30:
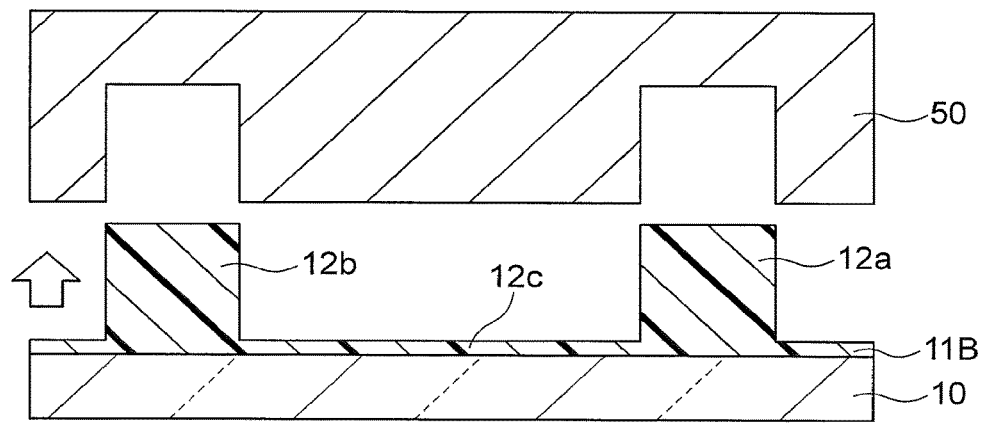

Referring now to FIGS. 29 and 30, a method of manufacturing the solar cell module of the fifth embodiment is described.

First, an epoxy-based ultraviolet curable resin 11B is applied onto a first substrate 10 formed with glass in a square shape of 500 mm×500 mm (FIG. 29). A quartz mold 50 having fine protrusions and recesses formed in advance is pressed against the resin film 11B. The resin film 11B is then irradiated with ultraviolet rays through the quartz mold 50, and thus is made to cure. As a result, the fine protrusions and recesses of the quartz mold 50 are copied onto the resin film 11B, and protruding partition walls 12a and 12b are formed on the first substrate 10 (FIG. 30). The partition walls 12a and 12b each have a width of 20 µm and a height of 20 µm, and the pitch of the partition walls 12a and 12b is 40 µm. At this point of time, the height of the resin film 11B in the recesses 12c from the first substrate 10 is 10 µm. The epoxy-based ultraviolet curable resin film 11B after the curing has a light transmittance of 90% or higher at wavelengths of 380 nm to 800 nm, and has a refractive index between 1.56 and 1.73 at a wavelength of 580 nm.

On the epoxy-based ultraviolet curable resin 11B, the first electrodes 14 and the organic photoelectric conversion films 16 are formed by the same process as the process according to the manufacturing method described in the third embodiment. The first electrodes 14 are formed with ITO patterns having a thickness of 300 nm. The organic photoelectric conversion films 16 each include: a 10-nm thick zinc oxide layer as the electron transport layer; a 100-nm thick organic active layer formed by mixing poly(3-methylthiophene) as the p-type semiconductor material and [6,6]-phenyl $C_{61}$ butyric acid methyl ester (60PCBM) as the n-type semiconductor material at a ratio of 1:2 (p:n); and a 10-nm thick vanadium oxide layer as the hole transport layer. On the organic photoelectric conversion films 16, 200-nm thick Ag films are formed as the second electrodes 18. Further, the recesses 12c between the partition walls 12a and 12b are filled with an epoxy resin film 19 containing a material having low moisture permeability. An aluminum-deposited PET film to be the second substrate 20 is joined to the epoxy resin film 19. A heat treatment is then performed at 80° C. for one hour, so that the solar cell module in which the cells 2 are separated from one another by the partition walls 12a and 12b is completed.

A durability test was conducted on the solar cell module manufactured by the above described manufacturing method. The sealing width and region at the end portions were small, and the sealing height between the first substrate and the second substrate was as small as approximately 30 µm. Despite these aspects, moisture infiltration through the end portions was prevented, and a high durability was achieved. Furthermore, as the partition walls 12a and 12b were formed with the transparent resin film 11B having a high refractive index, light entering through the first substrate 10 made of glass was effectively confined, and photoelectric conversion efficiency was increased approximately 2%.

Like the third embodiment, the fifth embodiment can provide a solar cell module that is capable of preventing the no-power generating regions from expanding, and preventing decreases in durability.

Sixth Embodiment

Figure 31:
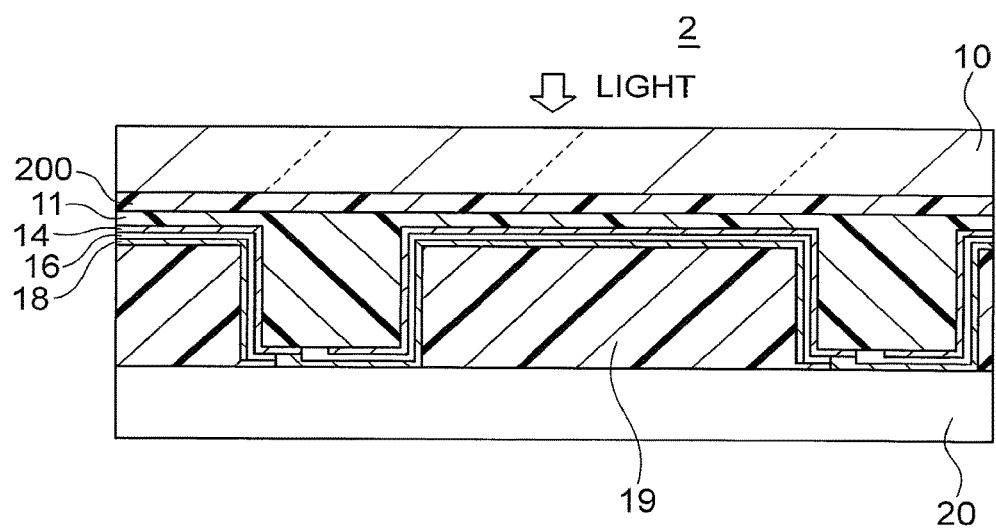
FIG. 31 is a cross-sectional view of a cell of a solar cell module according to a sixth embodiment.

FIG. 31 shows a cross-section of a cell 2 of a solar cell module according to a sixth embodiment. The solar cell module of the sixth embodiment differs from the solar cell module 1 of the first embodiment shown in FIGS. 1 and 2, in that each cell 2 includes a transparent material layer 200 having low moisture permeability between the first substrate 10 and the resin film 11. Except for this material layer 200, the solar cell module of the sixth embodiment has the same structure as the solar cell module of the first embodiment.

Referring now to FIGS. 32 through 35, a method of manufacturing the solar cell module of the sixth embodiment is described.

Figure 32:
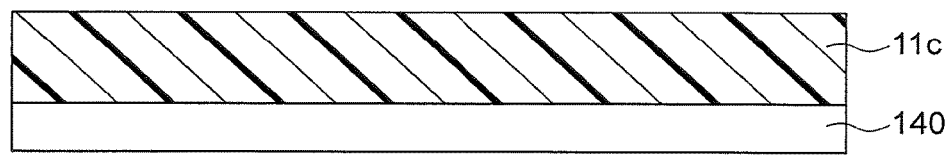
FIGS. 32 to 35 are cross-sectional diagrams showing a method of manufacturing the solar cell module according to the sixth embodiment.
Figure 33:
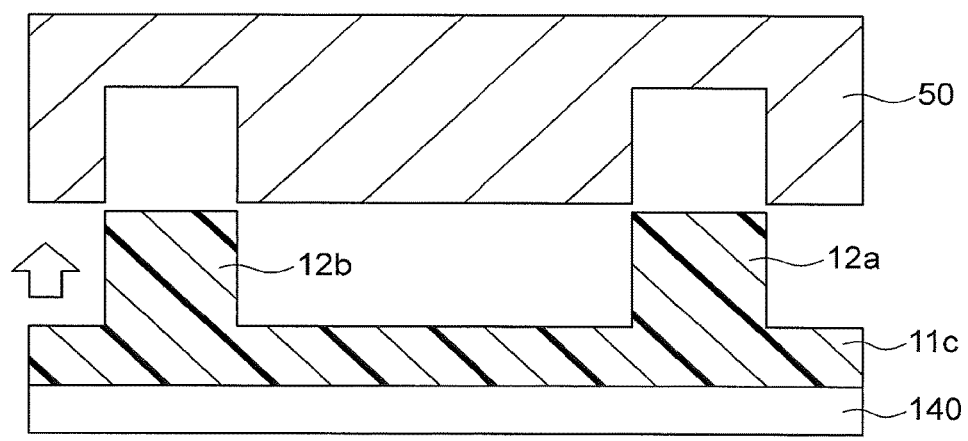

First, a thermosetting epoxy resin 11C that has a light transmittance of 88% or higher in wavelength regions at 380 nm to 800 nm is applied onto a supporting substrate 140 (FIG. 32). The epoxy resin 11C contains a pigment or a fluorescent material that absorbs ultraviolet rays at 320 nm to 380 nm and converts the ultraviolet rays into light in a wavelength region at 380 nm or longer. A metal mold 50 that has fine protrusions and recesses formed by machine processing in advance is pressed against the epoxy resin film 11C, and the pressed state is maintained at 100° C. for ten minutes, so that the fine protrusions and recesses are copied onto the epoxy resin film 11C, which is then made to cure. After the curing, the metal mold 50 is removed (FIG. 33). As a result, a resin film 11C having protruding partition walls 12a and 12b on the surface thereof is formed. The partition walls 12a and 12b each have a width of 20 µm and a height of 20 µm, and the pitch of the partition walls 12a and 12b is 50 µm. In the resin film 11C, recesses 12c having a height of 5 µm are also formed between the partition walls 12a and 12b. After that, the supporting substrate 140 is removed from the resin film 11C.

Figure 34:
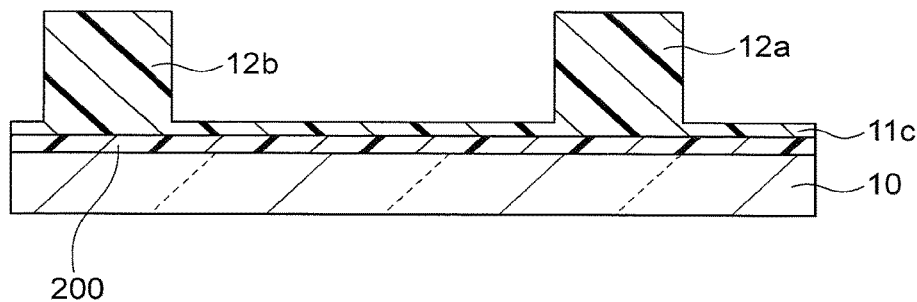

A PET film having a light transmittance of 90% or higher at wavelengths of 380 nm to 800 nm is used as the transparent first substrate 10. The material layer 200 is formed on the first substrate 10. The material layer 200 is formed by applying an epoxy-based resin onto the first substrate 10. The resin contains a moisture-absorbing desiccant material, has a light transmittance of 90% or higher in wavelength regions at 380 nm to 800 nm, and has low moisture permeability. This resin is to serve as an adhesive. The resin film 11C formed in the step illustrated in FIG. 33 is placed on the resin layer 200. A heat treatment is then performed at 80° C. for one hour, so that the resin film 11C and the first substrate 10 are joined to each other (FIG. 34). The thickness of the resin layer 200 after curing is 20 µm.

Figure 35:
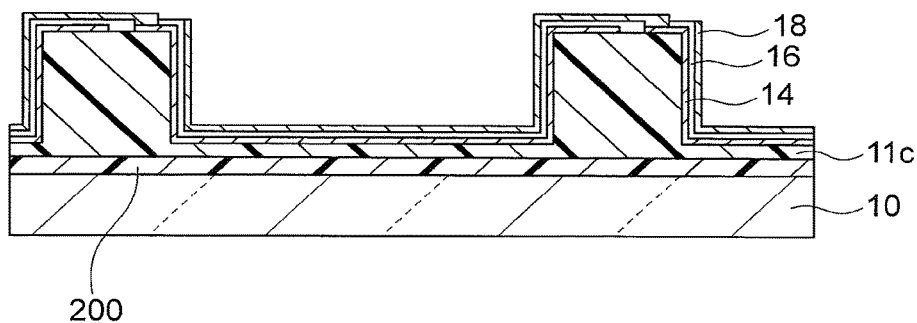

On the first substrate 10 to which the resin film 11C having the partition walls 12a and 12b is joined, the first electrodes 14 and the organic photoelectric conversion films 16 are formed by the same process as the process according to the manufacturing method described in the third embodiment. The first electrodes 14 are formed with ITO patterns having a thickness of 300 nm. The organic photoelectric conversion films 16 each include: a 10-nm thick zinc oxide layer as the electron transport layer; a 100-nm thick organic active layer formed by mixing poly(3-methylthiophene) as the p-type semiconductor material and [6,6]-phenyl $C_{61}$ butyric acid methyl ester (60PCBM) as the n-type semiconductor material at a ratio of 1:2 (p:n); and a 10-nm thick vanadium oxide layer as the hole transport layer. In each organic photoelectric conversion film 16, the zinc oxide layer, the organic active layer, and the vanadium oxide layer are stacked. On the organic photoelectric conversion films 16, 200-nm thick Ag films are formed as the second electrodes 18 (FIG. 35). Further, the recesses 12c between the partition walls 12a and 12b are filled with an epoxy resin film 19 containing a desiccant material. An aluminum-deposited PET film to be the second substrate 20 is joined to the epoxy resin film 19. A heat treatment is then performed at 80° C. for one hour, so that the solar cell module 1 in which the cells 2 are separated from one another by the partition walls 12a and 12b is completed (FIG. 31).

A durability test was conducted on the solar cell module 1 manufactured by the above described manufacturing method. The sealing width and region at the end portions were small, and the sealing height between the first substrate 10 and the second substrate 20 was as small as approximately 45 µm. Despite these aspects, moisture infiltration through the end portions was prevented, and a high durability was achieved.

The partition walls 12a and 12b were made of the resin 11C containing a wavelength conversion material in this embodiment. Because of this, the photoelectric conversion efficiency was increased approximately 2%, compared with the photoelectric conversion efficiency of a solar cell module of a comparative example including no partition walls 12a and 12b. Degradation of the organic active layers due to continuous light irradiation was also reduced.

Furthermore, as the epoxy resin 200 containing a desiccant material was inserted between the first substrate 10 and the resin layer 11C, moisture infiltration through the first substrate 10 was prevented, and a highly reliable solar cell module was obtained.

Like the third embodiment, the sixth embodiment can provide a solar cell module that is capable of preventing the no-power generating regions from expanding, and preventing decreases in durability.

Seventh Embodiment

Figure 36:
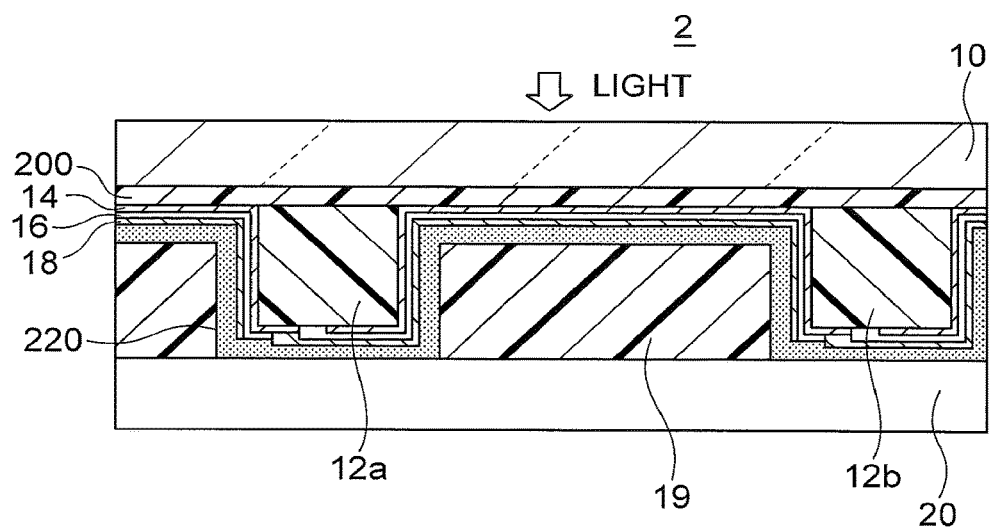
FIG. 36 is a cross-sectional view of a cell of a solar cell module according to a seventh embodiment.

FIG. 36 shows a cell of a solar cell module according to a seventh embodiment. FIG. 36 is a cross-sectional view of a cell 2 of the solar cell module of the seventh embodiment. The solar cell module of the seventh embodiment is the same as the solar cell module of the sixth embodiment shown in FIG. 31, except that a protection film 220 having low moisture permeability is disposed between the second electrode 18 and the resin film 19.

Referring now to FIGS. 37 through 42, a method of manufacturing the solar cell module of the seventh embodiment is described.

Figure 37:
FIGS. 37 to 42 are cross-sectional diagrams showing a method of manufacturing the solar cell module according to the seventh embodiment.
Figure 38:
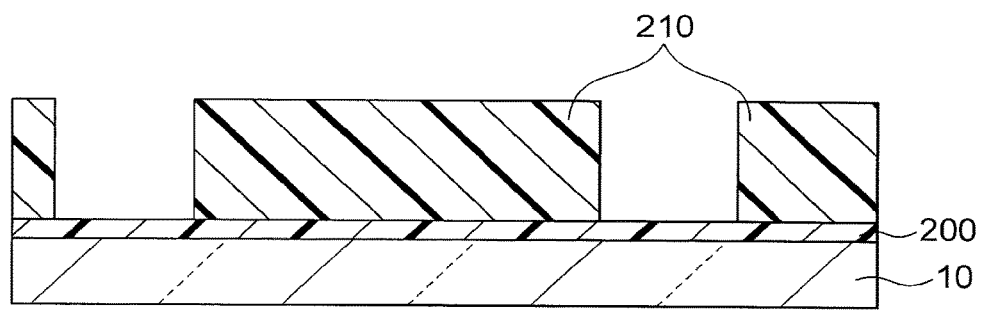
Figure 39:
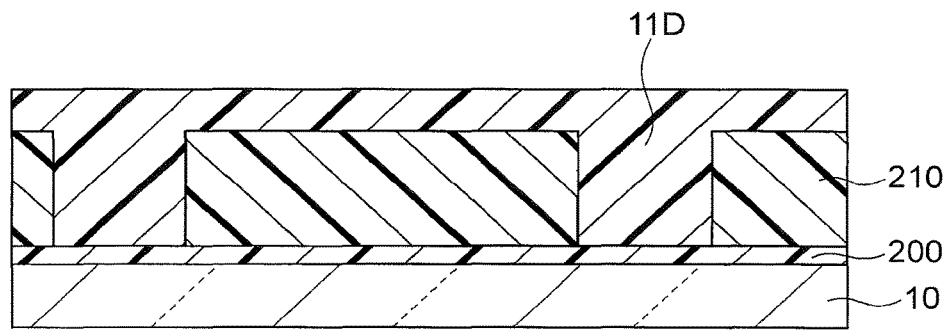
Figure 40:
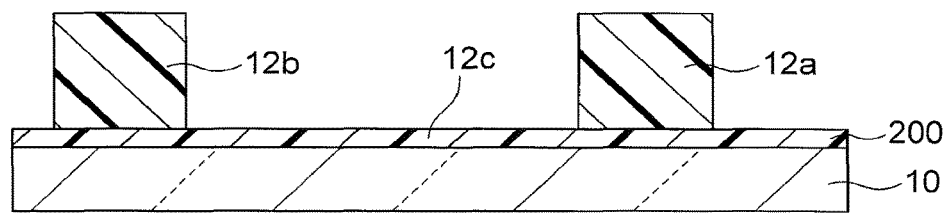

First, a PET film having a light transmittance of 90% or higher at wavelengths of 380 nm to 800 nm is used as the transparent first substrate 10. On the entire surface of the first substrate 10, a stacked film including a 30-nm thick silicon oxynitride layer and a 30-nm thick silicon oxide layer is formed as a transparent inorganic film 200 by sputtering (FIG. 37). The inorganic film 200 has shielding properties against water vapor. Resist patterns 210 are then formed on the inorganic film 200 (FIG. 38) A solution in which titanium oxide is dissolved is applied onto the resist patterns 210, to form an inorganic film 11D having low moisture permeability. The inorganic film 11D is then dried (FIG. 39). The resist patterns 210 are removed by a liftoff technique, so that protruding partition walls 12a and 12b are formed with 1-µm thick titanium oxide films (FIG. 40). In this manner, fine protruding partition walls 12a and 12b having a width of 10 µm, a height of 1 µm, and a pitch of 50 µm are formed (FIG. 40). Recesses 12c are also formed between the partition walls 12a and 12b.

Figure 41:
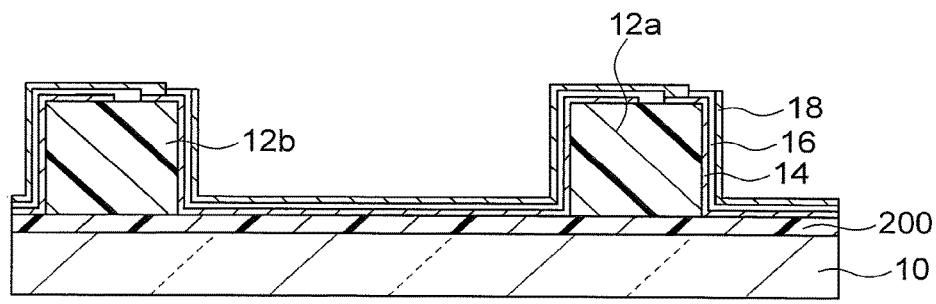
Figure 42:
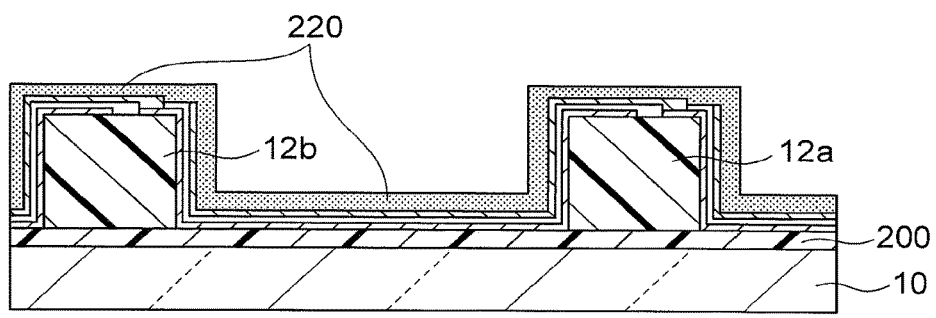

On the first substrate 10 having the partition walls 12a and 12b formed thereon, the first electrodes 14 and the organic photoelectric conversion films 16 are formed by the same process as the process according to the manufacturing method described in the third embodiment. The first electrodes 14 are formed with ITO patterns having a thickness of 300 nm. The organic photoelectric conversion films 16 each include: a 10-nm thick zinc oxide layer as the electron transport layer; a 100-nm thick organic active layer formed by mixing poly(3-methylthiophene) as the p-type semiconductor material and [6,6]-phenyl $C_{61}$ butyric acid methyl ester (60PCBM) as the n-type semiconductor material at a ratio of 1:1.2; and a 10-nm thick vanadium oxide layer as the hole transport layer. On the organic photoelectric conversion films 16, 200-nm thick Ag films are formed as the second electrodes 18 (FIG. 41). On the second electrodes 18, a 30-nm thick silicon oxide film is formed as the protection film 220 having low moisture permeability by vapor deposition (FIG. 42). The recesses 12c between the partition walls 12a and 12b are then filled with an epoxy resin film 19 containing a desiccant material. An aluminum-deposited PET film to be the second substrate 20 is joined to the resin film 19. A heat treatment is then performed at 80° C. for one hour, so that the solar cell module in which the cells 2 are separated from one another by the partition walls 12a and 12b is completed (FIG. 36). A silicon oxide film is used as the protection film 220 having low moisture permeability in this embodiment. However, it is possible to use any inorganic compound film having a low moisture vapor transmission rate. For example, the protection film 220 may be formed with a metal oxide film such as a tungsten oxide film, a metal fluoride film such as a lithium fluoride film, a metal nitride film such as a silicon nitride film, or a metal oxynitride film such as a silicon oxide nitride film. Also, a stacked film including two or more of the above films may be used.

Alternatively, the protection film 220 may be formed with a resin film containing an inorganic desiccant material such as calcium oxide or zeolite, or a resin film containing a polyacrylic water-absorbing polymeric material or the like. Also, it is possible to use a stack structure including any of the above inorganic compounds and any of the above resin films.

A durability test was conducted on the solar cell module manufactured by the above described manufacturing method. The sealing width and region at the end portions were small, and the sealing height between the first substrate and the second substrate was as small as approximately 1 µm. Despite these aspects, moisture infiltration through the end portions was prevented, and a high durability was achieved. Furthermore, the transparent and low moisture permeability film 200 was formed on the entire surface of the first substrate, and the cells 2 were covered with the protection film 220 having low moisture permeability. Thus, a highly reliable solar cell module was obtained.

Like the third embodiment, the seventh embodiment can provide a solar cell module that is capable of preventing the no-power generating regions from expanding, and preventing decreases in durability.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A module comprising:
   a light transmissive first substrate;
   a second substrate;
   at least one cell array disposed between the first substrate and the second substrate, the at least one cell array including a plurality of cells arranged, each of the cells including a first electrode disposed on the first substrate, a photoelectric conversion film disposed on the first electrode, and a second electrode disposed on the photoelectric conversion film;
   a plurality of light transmissive partition walls disposed at portions on the first substrate, the portions being located between adjacent ones of the cells and at both end portions of the at least one cell array; and
   a first resin film disposed between the second substrate and each of the cells between adjacent ones of the partition walls,
   wherein the cells are connected in series, and
   wherein:
   the first electrode, the photoelectric conversion film, and the second electrode of each of the cells extend onto side surfaces and upper surfaces of the partition walls at opposite end portions of each of the cells; and,
   in two adjacent ones of the cells,
   a first gap is interposed between the first electrodes arranged on the upper surface of the partition wall located between the two adjacent cells,
   a second gap is interposed between the photoelectric conversion films, and,
   at the second gap, the first electrode of one of the two adjacent cells is connected to the second electrode of the other one of the two adjacent cells.

2. The module according to claim 1, wherein:
   the second gap is wider than the first gap.

3. The module according to claim 1, further comprising a light transmissive first layer disposed between each of the cells and the first substrate.

4. The module according to claim 3, wherein the first layer is made of the same material as the partition walls.

5. The module according to claim 1, wherein the partition walls are made of the same material as the first substrate.

6. The module according to claim 1, wherein each of the partition walls is a second resin film containing one of a pigment and a fluorescent material, the one of the pigment and the fluorescent material absorbing ultraviolet light at 320 nm to 380 nm and converting the ultraviolet light into light in a wavelength region at 380 nm or longer.

7. The module according to claim 1, wherein each of the partition walls is a second resin film having a light transmittance of 90% or higher at a wavelength of 380 nm to 800 nm, and a refractive index of 1.56 to 1.73.

8. The module according to claim 3, further comprising a second layer disposed between the first substrate and each of the cells and each of the partition walls, the second layer containing a moisture-absorbing material.

9. The module according to claim 8, further comprising a third layer disposed between the second electrode of each of the cells and the first resin film, the third layer containing a moisture-absorbing material.

10. The module according to claim 8, further comprising a protection film disposed between the second electrode of each of the cells and the first resin film, the protection film containing at least one of metal oxide, metal fluoride, metal nitride, metal oxynitride, a resin containing a desiccant material, and a resin containing a polyacrylic polymer absorber.

11. The module according to claim 1, wherein the photoelectric conversion film of each of the cells includes an electron transport layer, a hole transport layer, and a photoelectric conversion layer disposed between the electron transport layer and the hole transport layer.

12. The module according to claim 1, wherein a plurality of the cell arrays are arranged in parallel.

13. The module according to claim 1, further comprising:
   a third electrode disposed at one end portion of the at least one cell array, the third electrode being connected to the first electrode of one of the cells at the one end portion;
   a fourth electrode disposed at a second end portion of the at least one cell array, the fourth electrode being connected to the second electrode of one of the cells at the second end portion;
   a first leading line connected to the third electrode of the at least one cell array;
   a second leading line connected to the fourth electrode of the at least one cell array;
   a first leading electrode connected to the first leading line; and
   a second leading electrode connected to the second leading line.

14. The module according to claim 1, wherein the module is a solar cell module.

15. The module according to claim 2, wherein the module is a solar cell module.

* * * * *